(12) United States Patent
Yamahira et al.

(10) Patent No.: US 7,449,918 B2
(45) Date of Patent: Nov. 11, 2008

(54) LEVEL SHIFT CIRCUIT

(75) Inventors: Seiji Yamahira, Kyoto (JP); Toshiki Mori, Osaka (JP)

(73) Assignee: Panasonic Corporation, Osaka (JP)

( * ) Notice: Subject to any disclaimer, the term of this patent is extended or adjusted under 35 U.S.C. 154(b) by 34 days.

(21) Appl. No.: 11/642,965

(22) Filed: Dec. 21, 2006

(65) Prior Publication Data

US 2007/0188192 A1 Aug. 16, 2007

(30) Foreign Application Priority Data

Dec. 22, 2005 (JP) ............................. 2005-370469
Dec. 21, 2006 (JP) ............................. 2006-344951

(51) Int. Cl.
*H03K 19/0175* (2006.01)

(52) U.S. Cl. ........................................... 326/81; 326/68

(58) Field of Classification Search ............. 326/80–81, 326/68, 83, 86
See application file for complete search history.

(56) References Cited

U.S. PATENT DOCUMENTS 6,700,429 B2 * 3/2004 Kanno et al. ................. 327/333
6,940,332 B2 * 9/2005 Yamahira et al. ............ 327/333
7,085,177 B2 * 8/2006 Savage ..................... 365/189.11

FOREIGN PATENT DOCUMENTS

JP 2004-153524 A 5/2004

\* cited by examiner

*Primary Examiner*—James H Cho
(74) *Attorney, Agent, or Firm*—McDermott Will & Emery LLP

(57) ABSTRACT

To provide a single-ended-output-type level shift circuit capable of improving an increase in a delay time according to a voltage level shift operation at low voltage and suppressing an increase in an area occupied by the circuit, first and second inverters 300 and 200 of a CMOS type in which a gate of each MOS transistor is individually driven are provided and the first inverter 300 is used as a level converting unit. A voltage level of a first control signal CS1 output from an output node no1 of the first inverter 300 is forcibly dropped down by a voltage dropping circuit CONT1 so as to accelerate the operation of the second inverter 200. As a result, the inversion of the level of an output signal of the first inverter 300 is accelerated. Further, the balance between current capabilities of the individual transistors is optimized and, in particular, the sizes of the transistors constituting the second inverter 200 are reduced so as to suppress an increase in a circuit area.

17 Claims, 18 Drawing Sheets

*FIG. 1*
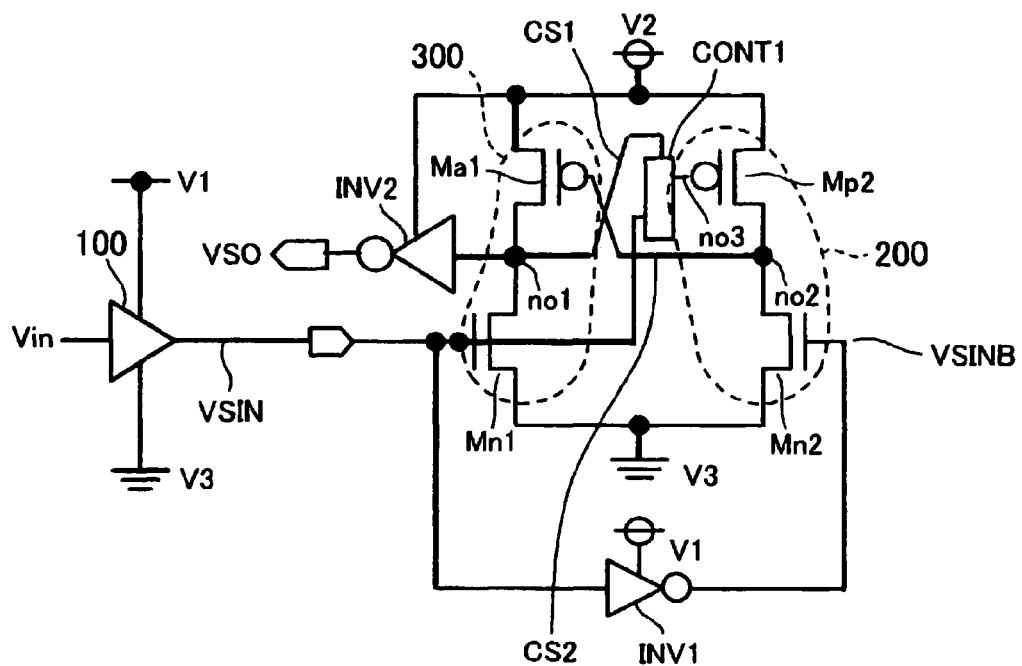
*FIG. 2 (a)*          *FIG. 2 (b)*
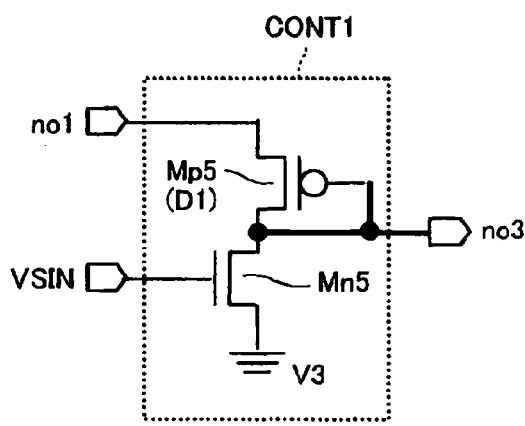      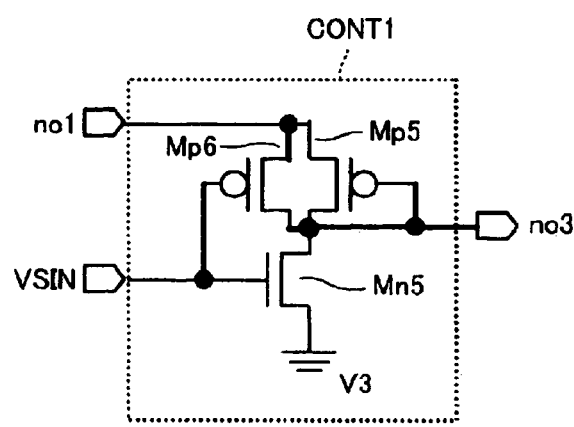

LEVEL SHIFT CIRCUIT

BACKGROUND OF THE INVENTION

1. Field of the Invention

The present invention relates to a level shift circuit. More specifically, the invention relates to a level shift circuit capable of performing logical inversion at high speed by preventing an increase in an area even when an input voltage is low.

2. Description of the Related Art

In order to reduce the area of a circuit mounted on a chip or ensure an operation margin of the circuit, voltage levels of power voltages of circuits in the same chip or of a plurality of chips may be different from one another. In this case, a voltage level of a control signal is converted by means of a level shift circuit. However, even when the difference between the voltage levels of the power voltages is large or changed, in order to stabilize the operation of the circuit, it is needed to ensure a timing margin.

FIG. 18 is a circuit diagram illustrating the structure of an example of a level shift circuit according to the related art.

In FIG. 18, reference numeral 100 denotes an input buffer (in which an input and an output have the same phase) provided in the previous stage of a level shift circuit. The input buffer 100 is a circuit operating at a power voltage V1. When receiving a signal Vin, the input buffer 100 outputs a signal VSIN having the same phase as the input signal Vin. The signal VSIN becomes an input signal to the level shift circuit.

Also, an inverter INV2 outputting a level-shifted output signal VSO is provided in order to make the output signal VSO of the level shift circuit have the same phase as the input signal VSIN, but is not an essential component of the level shift circuit. The inverter INV2 operates at a power voltage V2.

The level shift circuit is a double-ended output circuit type (a circuit type in which the number of output signals is two) including: a first inverter 300 composed of an NMOS transistor Mn1 and a PMOS transistor Mp1 connected in series with each other between a high-level power potential V2 and a common potential V3 (ground); a second inverter 200 composed of an NMOS transistor Mn2 and a PMOS transistor Mp2 connected in series with each other between the high-level power potential V2 and the common potential V3 (ground); and an inverter INV1 operating at the power voltage V1 and applying a signal VSINB, into which the voltage level of the power voltage V1 is inverted, to the NMOS transistor Mn2.

In FIG. 18, a reference symbol no1 denotes a common connection point of the NMOS transistor Mn1 and the PMOS transistor Mp1 constituting the first inverter 300. Similarly, a reference symbol no2 denotes a common connection point of the NMOS transistor Mn2 and the PMOS transistor Mp2 constituting the second inverter 200.

Also, in FIG. 18, a reference symbol CS1 denotes a first control signal which is output from the first inverter 300 and is applied to the high-level-side PMOS transistor Mp2 of the second inverter 200. Similarly, a reference symbol CS2 denotes a second control signal which is output from the second inverter 200 and is applied to the high-level-side PMOS transistor Mp1 of the first inverter 300.

FIG. 20 is a diagram illustrating an equivalent circuit of the level shift circuit shown in FIG. 18 for facilitating the understanding of the basic structure and operation of the level shift circuit shown in FIG. 18. The circuit shown in FIG. 20 and the circuit shown in FIG. 18 are exactly the same as each other. However, in FIG. 20, the circuit is illustrated considering a single-ended output type level shifter circuit such that it can be easily understood that the circuit is formed by combining a plurality of inverters.

As shown in FIG. 20, if necessary, the level shift circuit shown in FIG. 18 is a level shift circuit which includes the first inverter 300 composed of the PMOS transistor Mp1 and the NMOS transistor Mn1 connected in series with each other between the high-level power potential V1 and the low-level common potential V3 (which may be referred to as a ground potential VSS), complementarily turns on the PMOS transistor Mp1 and the NMOS transistor Mn1 according to the input signal VSIN (when being turned on, the PMOS transistor Mp1 and the NMOS transistor Mn1 are saturated), and outputs, from the common connection point no1 of the PMOS and NMOS transistors Mp1 and Mn1, H/L (high-level/low-level) signals having substantially the same levels as the power potentials V2 and V3, respectively. In this case, the voltage level of the output signal full swings between the power potentials.

The first inverter 300 is a CMOS-type inverter, while the gates of the NMOS transistor Mn1 and the PMOS transistor Mp1 are not connected to a common node and the transistors are individually driven. In other words, the NMOS transistor Mn1 is directly driven by the input signal VSIN, and the PMOS transistor Mp1 is driven by a signal obtained by inverting the voltage level of the input signal VSIN by means of the inverter INV1 and the second inverter 200. The second inverter 200 has the same structure as the first inverter 300 and is composed of the NMOS transistor Mn2 and the PMOS transistor Mp2. The second control signal CS2 is output from the common connection point no2 of the NMOS and PMOS transistors Mn2 and Mp2.

When the level shift circuit is used as a single-ended output circuit, the second inverter 200 does not directly participate in conversion of the level of the input signal but fulfills an auxiliary function of increasing the speed of the operation of the first inverter 300 (that is, speeding the turn-on of the PMOS transistor Mp1).

The NMOS transistor Mn2 constituting the second inverter 200 is driven by the signal obtained by inverting the voltage level of the input signal VSIN by means of the inverter INV1. The PMOS transistor Mp2 is driven by a first control signal CS1 (which is a conversion output signal of the first inverter 300) from the first inverter 300.

In FIG. 20, the paths of the first and second control signals CS1 and CS2 are shown by heavy lines. Also, FIG. 20 shows how the voltage level of each unit of the level shift circuit is changed when the voltage level of the input signal of the buffer 100 provided in the previous stage of the level shift circuit is 'H' or 'L'.

Next, the operation of the level shift circuit shown in FIG. 18 (FIG. 19) will be described in detail.

In the following description, a timing chart of FIG. 19 is properly referred to. FIG. 19 is a timing chart illustrating variation in each of the signals VSIN, VSINB, and VSO of the level shift circuit shown in FIG. 18 and variation in the voltage at each of the nodes no1 and no2.

First, a case when the difference obtained by subtracting the voltage V1 from the voltage V2 is small will be described. Variation in the voltage of each unit in that case is illustrated by a full line. At a timing T1, when the input signal VSIN is changed from the low level to the high level, the signal VSINB is changed from the high level to the low level. As a result, the NMOS transistor Mn1 is turned on and the NMOS transistor Mn2 is turned off. At this time, the PMOS transistor Mp1 is in an ON state and the PMOS transistor Mp2 is in an OFF state and thus the voltage of the node no1 is changed from the high level to the low level on the basis of the magnitude relationship between the drain current capability Idsn1 of the NMOS transistor Mn1 and the drain current capability Idsp1 of the PMOS transistor Mp1.

According to the logical inversion of the potential of the node no1, at a timing T2, the PMOS transistor Mp2 is turned on. Thus, the potential of the node no2 is changed from the low level to the high level and simultaneously the potential of the inverter INV2 is changed from the low level to the high level. At a timing T4, when the signal VSIN is changed form the high level to the low level, the signal VSINB is changed from the low level to the high level. As a result, the NMOS transistor Mn1 is turned off and the NMOS transistor Mn2 is turned on. At this time, since the PMOS transistor Mp1 is in the OFF state and the PMOS transistor Mp2 is in the ON state, the potential of the node no2 is changed from the high level to the low level on the basis of the magnitude relationship between the drain current capability Idsn2 of the NMOS transistor Mn2 and the drain current capability Idsp2 of the PMOS transistor Mp2. According to the logical inversion of the potential of the node no2, at a timing T5, the PMOS transistor Mp1 is turned on. Thus, the potential of the node no1 is changed from the low level to the high level. Then, at a timing T6, the potential of the inverter INV2 is changed from the high level to the low level.

As described above, in the related art, when the logical inversion is performed, the operation starts by changing the potentials of the nodes no1 and no2 according to the difference between the drain currents of the NMOS and PMOS transistors Mn1 and Mp1 turned on or the difference between the drain currents of the NMOS and PMOS transistors Mn2 and Mp2.

Therefore, when the difference obtained by subtract the power voltage V1 from the power voltage V2 increases due to a decrease in the power voltage V1 or an increase in the voltage V2, a time it takes for the potentials of the nodes no1 and no2 to be changed from the high level to the low level is expended and thus a time it takes to perform the logical inversion is expended and the amount of delay of each of a rising time Tr2 and a falling time Tf2 is changed. In FIG. 19, variation in the voltages when the voltage V1 decreases is shown in a dotted line. When the difference between the power potentials V2 and V1 increases due to the decrease in the power potential V1, a large amount of delay occurs in variation in the potential of each signal.

The level shift circuit having the structure shown in FIG. 18 is disclosed in FIG. 14A of Patent Document 1 applied by the inventors.

Patent Document 1: JP-A-2004-153524

In the case of the level shift circuit shown in FIG. 18, when the difference obtained by subtract the power potential V1 from the power potential V2 is large, as described above, the delay from the input to the output of the level shift circuit is extended, and the delay time of an output signal when the input signal is changed form the high level to the low level becomes larger than the delay time of the output signal when the input signal is changed from the low level to the high level.

Here, a case where the level shift circuit shown in FIG. 18 generates a control clock of a voltage booster circuit, which generates a voltage exceeding an external voltage by voltage boosting cells disposed in a plurality of stages, is considered. In this case, it is needed to raise the level of an original clock output from a low power circuit (whose power voltage is V1) to a voltage level that corresponds to a high power circuit (whose power voltage is V2) and is enough to control the operation of a charge pump circuit.

In the circuit operating at the low voltage, recently, since the decrease in the power voltage is rapidly progressing, the potential difference between the voltages V1 and V2 tends to increase. Also, the control clock controlling the operation of each of the plurality of voltage boosting cells is a multi-phase clock having a timing controlled with a high degree of accuracy. Therefore, when converting the level of an original clock signal, if a timing delay occurs, it is difficult to ensure an appropriate timing margin, to perform proper voltage pumping, and to obtain a desired voltage boosting characteristic. Therefore, it is possible to obtain a level shift circuit in which, even when the voltage difference between the voltages V1 and V2 increases, the delay of local inversion does not increase.

In the level shift circuit having the above-mentioned structure, since the voltage level of an output voltage is changed due to the current capability difference between the PMOS and NMOS transistors connected in series with each other between the power voltages. Therefore, in order to change the voltage level of the output voltage more quickly, it is needed to sufficiently ensure the current capability of the NMOS transistor in the first inverter (reference numeral 300 in FIG. 18). The gate of the NMOS transistor of the first inverter is driven by the output of the low power circuit. For this reason, as the power voltage V1 of the low power circuit decreases, the driving capability of the NMOS transistor is reduced. In order to improve this situation, it is necessary to increase the size of the NMOS transistor. However, the increase in the size of the NMOS transistor causes an increase in the area which the NMOS transistor occupies in the circuit, which hinders an integration degree in being improved. For this reason, it is needed to minimize the increase in the area which the NMOS transistor occupies in the circuit.

The invention has been made based on the above-mentioned situation. An advantage of some aspects of the invention is that it provides a level shift circuit, in which, in the case where an input and an output have an one-to-one correspondence relationship, local inversion is performed at high speed even when a difference between voltage levels of power voltages (V2-V1) is large, and which can ensure a timing margin when is used to, for example, a voltage booster circuit.

According to a first aspect of the invention, a level shift circuit includes: a first inverter 300 that functions as a level converting unit for converting a voltage level of an input signal VSIN; a second inverter 200 that has a function of accelerating the operation of the first inverter and receiving a signal obtained by inverting the voltage level of the input signal; and a voltage dropping circuit CONT1 that drops down a voltage level of a first control signal CS1 to a level capable of inverting the level of an output signal of the second inverter 200. In level shift circuit, a first control signal CS1 for controlling the operation of the second inverter 200 is output from an output node no1 of the first inverter, and a second control signal CS2 for controlling the operation of the first inverter 300 is output from an output node no2 of the second inverter 200. A signal obtained by dropping the voltage level of the first control signal CS1 by means of the voltage dropping circuit CONT1 is supplied to the second inverter 200.

When the input signal VSIN is changed from the low level to the high level, the voltage level of the output signal (which is also the first control signal) of the first inverter 300 is changed from the high level to the low level, while this change does not instantaneously occur. As described above, as the NMOS transistor turned on absorbs a drain current of the PMOS transistor in an ON state, the voltage level of the output signal is gradually dropped and is finally changed from the high level to the low level. In this case, when the current capability of the NMOS transistor is reduced due to a drop in a driving voltage, the change of the first control signal CS1 from the high level to the low level is slow, and the control of the operation of the second inverter 200 is delayed. Then, the level of the first control signal CS1 is forcibly dropped down by means of the voltage dropping circuit CONT1. This means that the change of the first control signal CS1 from the high level to the low level is accelerated. When receiving the first control signal, the second inverter 200 instantaneously operates to immediately generate the second control signal CS2. The second control signal CS2 is returned to the first inverter 300 so as to quickly control the operation of the first inverter 300. As a result, the speed of the change of the output signal of the first inverter from the high level to the low level is accelerated. Since the falling of the output signal of the first inverter is accelerated by electrical control, even when the difference between a low power V1 and a high power V2 becomes large, it is unnecessary to extremely increase the size of the transistor in order to ensure required current capability. Therefore, it is possible to reduce the area occupied by the circuit.

In the level shift circuit having the above-mentioned structure, the first inverter 300 may be composed of first and second MOS transistors Mn1 and Mp1 which are connected in series between power voltages and have different conduction types. Preferably, one of the first and second MOS transistors is directly driven by the input signal VSIN, and the other MOS transistor is driven by the second control signal output from the second inverter 200 such that the first and second Mos transistors Mn1 and Mp1 are complementarily driven to output an output signal VSO of the first inverter 300 and the first control signal CS1 from the common node no1 of the first and second MOS transistors. The second inverter 200 may be composed of third and fourth MOS transistors Mn2 and Mp2 which are connected in series between the power voltages and have different conduction types. Preferably, one of the third and fourth MOS transistors is driven by the signal obtained by inverting the voltage level of the input signal VSIN and the other MOS transistor is driven by the first control signal CS1 whose voltage level has been dropped down by means of the voltage dropping circuit CONT1 such that the third and fourth MOS transistors Mn2 and Mp2 are complementarily driven to output the second control signal CS2 from a common node no2 of the third and fourth MOS transistors.

The level shift circuit having this structure is a single-ended-output-type level shift circuit including two CMOS-type inverters in which a gate of each of the MOS transistors is individually driven. The first and second control signals CS1 and CS2 are obtained from the common connection nodes no1 and no2 of the transistors constituting CMOSs.

In the level shift circuit having the above-mentioned structure, the input signal may be a signal VSIN output from a circuit operating between a first power potential V1 of a high level and a common power potential V3 of a low level. The first inverter 300 may be composed of a low-potential-side first NMOS transistor Mn1 and a high-potential-side first PMOS transistor Mp1 which are connected in series between a second power potential V2 of a high level and the common power potential V3. The low-potential-side first NMOS transistor Mn1 may be directly driven by the input signal VSIN, and the high-potential-side first PMOS transistor Mp1 may be driven by the second control signal CS2 output from the second inverter 200. The second inverter 200 may be composed of a low-potential-side second NMOS transistor Mn2 and a high-potential-side second PMOS transistor Mp2 which are connected in series between the second power potential V2 and the common power potential V3. The low-potential-side second NMOS transistor Mn2 may be driven by the signal obtained by inverting the voltage level of the input signal VSIN, and the high-potential-side second PMOS transistor Mp2 may be driven by the first control signal CS1 having passed through the voltage dropping circuit CONT1.

The level shift circuit having this structure is a single-ended-output-type level shift circuit including two CMOS-type inverters in which a gate of each of the MOS transistors is individually driven. The level shift circuit operates at the high power voltage V2 and a previous circuit for applying a signal to the level shift circuit operates at the low power voltage V1. The first and second control signal CS1 and CS2 control ON/OFF of the PMOS transistors Mp2 and Mp1 of the second and first inverters, respectively.

In the level shift circuit having the above-mentioned structure, preferably, when the input signal VSIN is changed from a low level to a high level, the voltage dropping circuit CONT1 drops down the voltage level of the first control signal CS1 output from the first inverter 300 by an amount of voltage drop that is equal to or more than the absolute value of the threshold value of the high-potential-side second PMOS transistor Mp2 constituting the second inverter 200. Preferably, the first control signal CS1 whose voltage level has been dropped is supplied to the second PMOS transistor Mp2 to immediately turn on the second PMOS transistor Mp2, and thus the second control signal CS2 is output to the first inverter 300 so as to immediately reduce the current capability of the high-potential-side first PMOS transistor Mp1 of the first inverter 300, such that, even when the level difference between the first power potential V1 and the second power potential V2 becomes large, the change of the output signal VSO of the first inverter 300 from the high level to the low level is accelerated while suppressing an increase in the size of the first NMOS transistor Mn1.

The amount of voltage dropped by the voltage dropping circuit is set to be equal to or more than the absolute value of the threshold voltage of the high-potential-side PMOS transistor constituting the second inverter. Therefore, when the input signal is changed from the low level to the high level and the low-potential-side NMOS transistor Mn1 of the first inverter 300 is turned on to start to pull a current, the voltage level of the first control signal CS1 is instantaneously dropped down to a voltage level that is sufficient to turn on the high-potential-side PMOS transistor Mp2 of the second inverter 200 and thus the PMOS transistor Mp2 of the second inverter is instantaneously turned on so as to generate the second control signal CS2. Since the second control signal drives the PMOS transistor Mp1 of the first inverter 300, the current capability of the PMOS transistor Mp1 is rapidly reduced. That is, when the input signal is changed from the low level to the high level and the lower NMOS transistor Mn1 of the first inverter starts to pull the current, the current capability of the PMOS transistor Mp1 positioned immediately above the NMOS transistor Mn1 is reduced and thus the current supply from the high power potential V2 is reduced. Therefore, the potential of the common connection node no1 of the PMOS transistor and the NMOS transistor is rapidly changed to the low level. In other words, when the input signal is changed from the high level to the low level, the current capability of the upper PMOS transistor Mp1 is reduced so as to reduce the burden of the lower NMOS transistor Mn1 on the pulling of the current. This is apparently the same as the size of the NMOS transistor Mn1 becomes large so as to sufficiently ensure the current capability. That is, when an electrical mechanism instantaneously turning off the upper PMOS transistor Mp1 is provided, even when the potential difference between the voltages V1 and V2 becomes large, even though the size of the lower NMOS transistor Mn1 is not increased much, it is possible to sufficiently reduce the delay of the falling of the output voltage. Therefore, it is possible to suppress the area occupied by the circuit while reducing the timing delay in the level shift circuit.

In the level shift circuit having the above-mentioned structure, the voltage dropping circuit CONT1 may drop down the voltage level of the first control signal CS1 using a diode-connected MOS transistor (MOS diode).

A drop in the voltage by a predetermined amount of voltage is caused by the forward voltage of the diode-connected MOS transistor (MOS diode). The MOS diode can be easily formed using a MOS transistor and makes it easy to form the circuit. However, the voltage dropping circuit may be formed of other components (for example, PN-junction diodes or resistors).

In the level shift circuit having the above-mentioned structure, in the first inverter 300, the current capability of the low-potential-side first NMOS transistor Mn1 is larger than the current capability of the high-potential-side first PMOS transistor Mp1.

Since the low NMOS transistor Mn1 driven by the low power potential V1 is directly affected by the drop in the power potential, the reduction in the current capability is concerned. In this structure, since it is easy to sufficiently ensure the current capability, the size of the NMOS transistor Mn1 may be set to be lager than the size of the PMOS transistor Mp1.

In the level shift circuit having the above-mentioned structure, the size of the high-potential-side second PMOS transistor Mp2 constituting the second inverter 200 may be smaller than the size of the high-potential-side first PMOS transistor Mp1 constituting the first inverter 300.

When the level shift circuit is a single-ended-output-type level shift circuit, only the first inverter functions as the level converting unit, and the second inverter operates just accessorily. Therefore, the transistors constituting the second inverter need less current capability than the transistors constituting the first inverter. On the basis of this consideration, in the above-mentioned structure, the balance in the current capability is changed and the size of the PMOS transistor Mp2 constituting the second inverter is set to be smaller than the size of the PMOS transistor Mp1 constituting the first inverter so as to reduce the area occupied by the circuit.

In the level shift circuit having the above-mentioned structure, the size of the high-potential-side second PMOS transistor Mp2 constituting the second inverter 200 may be minimized as long as the high-potential-side second PMOS transistor Mp2 has the current capability turning on the high-potential-side first PMOS transistor Mp1 constituting the first inverter 300.

When the PMOS transistor Mp2 of the second inverter is turned on, since the NMOS transistor Mn2 positioned below the PMOS transistor is in the OFF state and the drain of the NMOS transistor is in a high impedance state (Z state), the PMOS transistor Mp2 may have only the current capability capable of outputting the second control signal CS2 to drive the PMOS transistor Mp1 of the first inverter. On the basis of this consideration, the size of the PMOS transistor Mp2 of the second inverter is minimized while ensuring the current capability capable of driving the PMOS transistor Mp1 of the first inverter, and the area occupied by the circuit is further reduced.

In the level shift circuit having the above-mentioned structure, the voltage dropping circuit CONT1 may include a PMOS transistor Mp7 whose gate electrode is connected to the source electrode of the PMOS transistor Mp2 of the second inverter and whose source electrode is connected to the gate electrode of the PMOS transistor Mp2 of the second inverter.

In this structure, when the input signal VSIN is changed from the low level to the high level, the NMOS transistor Mn1 is turned on to pull a current I1. In this case, when the amount of current I1 is small, the change of the output signal from the high level to the low level is delayed. However, this delay is minimized in this circuit. In other words, when the input signal VSIN is changed from the low level to the high level, the voltage of the output node no1 becomes V2 and the MOS diode D1 drops down the voltage V2 by a forward voltage Vdrop. In this case, since the gate electrode of the PMOS transistor Mp7 is connected to the source electrode of the PMOS transistor Mp2 of the second inverter and the source electrode of the PMOS transistor Mp7 is connected to the gate electrode of the PMOS transistor Mp2 of the second inverter, the voltage of the output node no2 corresponding to an input terminal of the first inverter is changed from V1 to V2, whereby the voltage $V_{GS}$ between the gate and source of the PMOS transistor Mp7 becomes small. Therefore, it is possible to suppress the amount of current flowing through the MOS transistors Mp1, Mp7, and Mn5 at the time of the logic inversion. Further, it is possible to reduce power consumption by suppressing the amount of current.

According to a second aspect of the invention, a level shift circuit includes: a fifth inverter 500 that functions as a level converting unit for converting a voltage level of an input signal VSIN; a sixth inverter 600 that receives a signal obtained by inverting the voltage level of the input signal of the fifth inverter 500; and a logic circuit 400 that receives a second control signal CS12 for controlling the operation of the fifth inverter 500 and outputs a third control signal CS10 to the fifth inverter 500. In this level shift circuit, a first control signal CS11 for controlling the operation of the sixth inverter 600 is output from an output node no11 of the fifth inverter, and the second control signal CS12 is output from an output node no12 of the sixth inverter 600.

In the level shift circuit according to the second aspect of the invention, the logic circuit may be composed of tenth and eleventh MOS transistors Mn10 and Mp11 whose conductivity types are different from each other, and the eleventh and twelfth MOS transistors may be driven by the second control signal CS12 output from the sixth inverter 600.

In this structure, it is possible to improve the current capability of the second PMOS transistor Mp2 by using the on-resistance of the eleventh MOS transistor Mp10 and the twelfth MOS transistor Mp12 and according a difference between power voltages V2 and V1, that is, V2-V1 when the difference V2-V1 is large. Further, it is possible to logically invert the voltage of the output node no11 at a high speed by easily logically inverting the voltage of the output node no12 being in a high-impedance state. Furthermore, it is possible to suppress a variation in a rising speed and a falling speed due to the potential difference of V2-V1 and to suppress an increase in an area so as to improve the inversion speed.

In the level shift circuit according to the second aspect of the invention, a gate of a thirteenth MOS transistor Mp13 constituting the fifth inverter may be directly driven by the input signal VSIN.

In this structure, since the gate of the fifth inverter is controlled by the input signal VSIN, when the difference V2-V1 becomes small and the input signal VSIN is changed from the low level to the high level, the on-resistance of the thirteenth MOS transistor Mp13 can increase. Therefore, it is possible to logically invert the voltage of the output node no11 at a high speed. Further, it is possible to suppress a variation in a rising speed and a falling speed due to the potential difference of V2-V1 and to suppress an increase in an area so as to improve the inversion speed.

Further, in the level shift circuit according to the second aspect of the invention, a gate of a thirteenth MOS transistor Mp14 constituting the fifth inverter may be driven by the second control signal CS12 output from the sixth inverter 600.

In this structure, when the potential difference V2-V1 is small and the input signal VSIN is changed from the low level to the high level, the potential of the no12 is changed from V1 to V2. Therefore, it is possible to decrease the voltage $V_{GS}$ between the gate and source of the transistor Mp14 and to reduce the amount of source-drain current. Further, it is possible to suppress the amount of current flowing through the MOS transistors Mp10, Mp14, and Mn11 and to reduce the power consumption.

In the level shift circuits according to the first and second aspects of the invention, the substrate bias of a MOS transistor Mp7 or Mp11 constituting the voltage dropping circuit may have the same potential as a MOS transistor Mp2 or Mp12 constituting an inverter 200 or 600 outputting a control signal for the MOS transistor Mp7 or Mp11.

In this structure, when a well of the PMOS transistor Mp7 of the gate voltage dropping circuit CONT1 is set to V2, it is possible to increase the on-resistance of the PMOS transistor Mp7 by a substrate bias effect and to increase the logic inversion speed.

In the level shift circuit according to the second aspect of the invention, the substrate bias for a MOS transistor Mp11, Mp13, or Mp14 constituting the fifth inverter may have the same potential as a MOS transistor Mp12 constituting a sixth inverter 600 outputting a control signal for the MOS transistor Mp7 or Mp11.

According to another aspect of the invention, a voltage booster circuit includes: clock generating circuits each using the above-mentioned level shift circuit to convert a voltage level of an original clock signal, and outputting the clock signal whose voltage level has been converted; and a plurality of voltage boosting cells whose internal operations are controlled by the generated clock signals.

When using the level shift according to the embodiment of the invention as the clock generating circuit, it is possible to reduce the delay of the clock signal whose level has been converted. Therefore, even when the potential difference between the low level power voltage V1 and the high level power voltage V2 becomes large, it is possible to ensure a predetermined operation margin in each voltage boosting cell. Therefore, it is possible to always perform a stable voltage boosting operation.

When a voltage dropping circuit is provided to only one of the two main inverters of the level shift circuit according to the embodiment of the invention, it is possible to realize a level shift circuit appropriate to a single-ended output type.

In the level shift circuit according to the embodiment of the invention, when the level of the input signal is changed, the level of the first control signal obtained from the output node no1 of the first inverter is instantaneously dropped, the second inverter is immediately driven, and the operation of the first inverter is immediately controlled by the second control signal output from the second inverter so as to accelerate the variation in the potential of the output node no1. Therefore, even when the potential difference between the low level power voltage V1 and the high level power voltage V2 becomes large, it is possible to quickly invert the voltage level of the output signal and to efficiently suppress the increase in the size of the transistor.

Further, in the single-ended-output-type level shift circuit, the balance between the current capability of the first inverter and the current capability of the second inverter is optimized taking notice that the second inverter does not directly contribute to the generation of the output signal. Further, as for the first inverter, the sufficient current capability is ensured to secure rapid output of the output signal, and as for the second inverter, the size of the transistor is reduced (minimized) while ensuring the required minimum current capability. Therefore, it is possible to reduce the area occupied by the circuit while ensuring the circuit operation at high speed.

When using the level shift circuit according to the embodiment of the invention as the clock generating circuit, it is possible to reduce the delay of the clock signal whose level has been converted. Therefore, even when the voltage difference between the low level power voltage V1 and the high level power voltage V2 increases, it is possible to ensure a predetermined operation margin in each voltage boosting cell. Therefore, it is possible to always perform a stable voltage boosting operation. The level shift circuit according to the embodiment of the invention can be used as a two-phase or four-phase clock generating circuit.

BRIEF DESCRIPTION OF THE DRAWINGS

FIG. 1 is a circuit diagram illustrating the structure of a level shift circuit according to a first embodiment of the invention.

FIGS. 2A and 2B are circuit diagrams illustrating an example of the detailed circuit structure of a gate voltage control circuit, serving as a voltage dropping circuit, of the level shift circuit shown in FIG. 1.

DESCRIPTION OF THE PREFERRED EMBODIMENTS

Hereinafter, a level shift circuit according to an embodiment of the invention will be described with reference to the accompanying drawings.

First Embodiment

FIG. 1 is a circuit diagram illustrating the structure of a level shift circuit according to an embodiment of the invention. FIGS. 2A and 2B are circuit diagrams illustrating an example of the detailed structure of a gate voltage control circuit, serving as a voltage dropping circuit, of the level shift circuit shown in FIG. 1.

Figure 18:
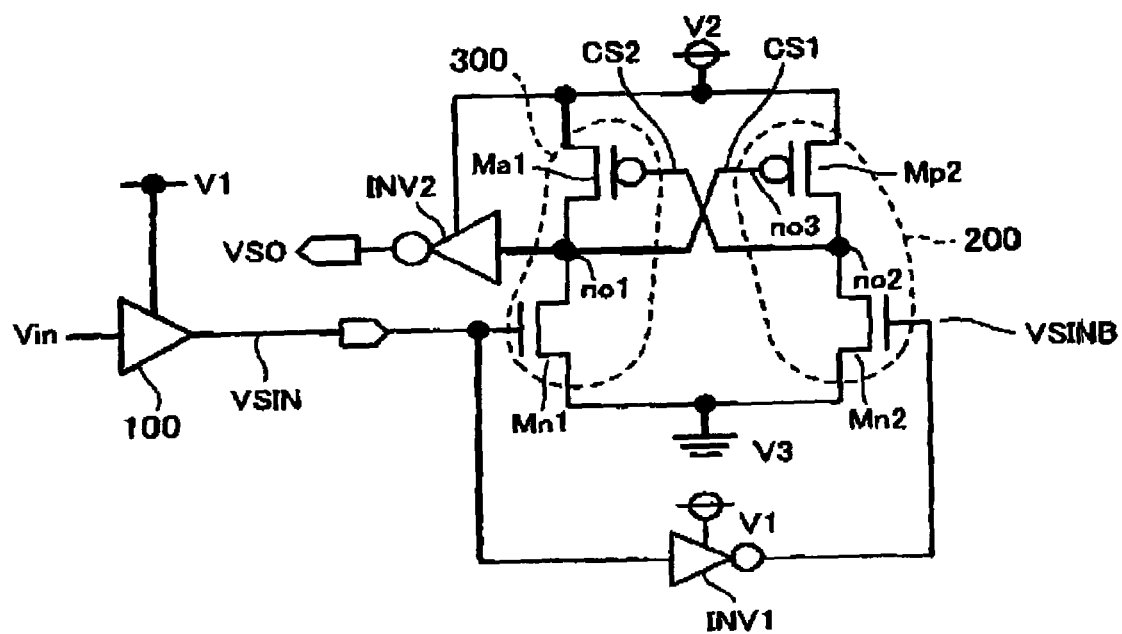
FIG. 18 is a circuit diagram illustrating the structure of an example of the level shift circuit according to the related art.
Figure 19:
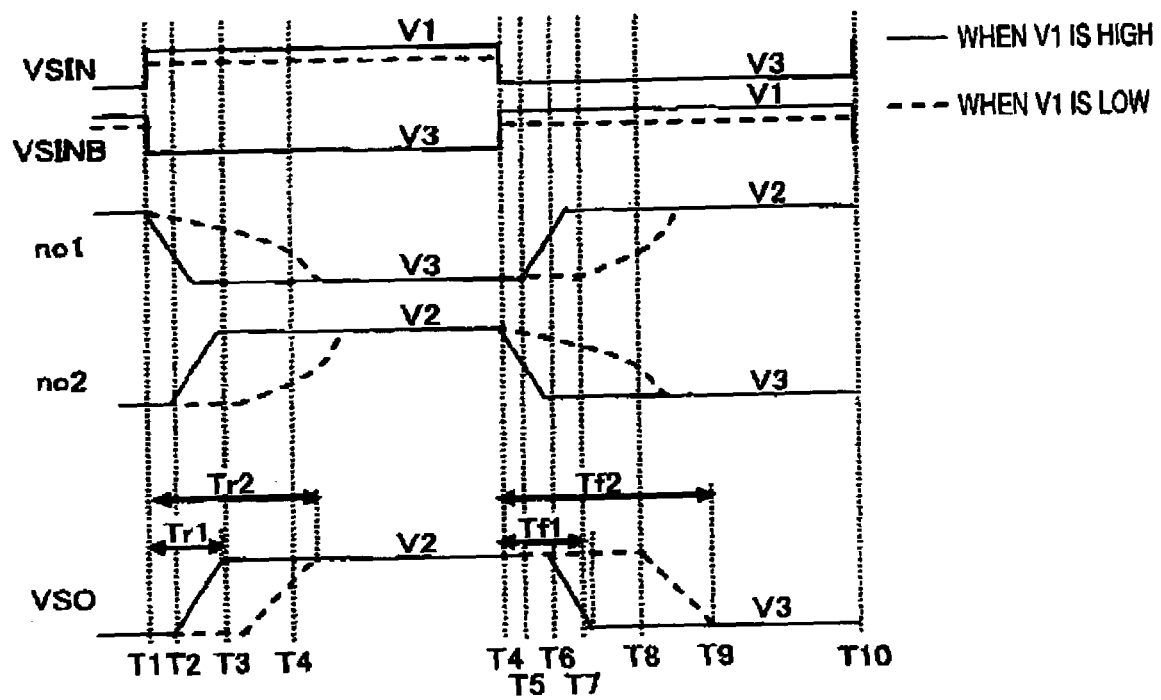
FIG. 19 is a timing chart illustrating variation in each of the signals VSIN, VSINB, and VSO of the level shift circuit shown in FIG. 18 and variation in the voltage at each of the nodes no1 and no2.

In FIG. 1, the same components as those in the level shift circuit shown in FIG. 18 have the same reference symbols. The level shift circuit according to this embodiment has the same basic structure as the level shift circuit shown in FIG. 18.

In FIG. 1, reference symbol CONT1 indicates a gate voltage control circuit which uses a potential of an output node no1 of a first inverter 300 as a power potential and outputs a potential lower than the potential of the output node no1 to a gate no3 of the second PMOS transistor Mp2 in response to an input signal VSIN (this gate voltage control circuit functions as a voltage dropping circuit dropping the voltage level of a first control signal CS1).

The gate voltage control circuit CONT1 shown in FIG. 2A is composed of a diode-connected PMOS transistor Mp5 (MOS diode D1) and an NMOS transistor Mn5 driven by the input signal VSIN.

In the gate voltage control circuit CONT1, when the input signal VSIN is changed from a low level to a high level, the NMOS transistor Mn5 is turned on to pull a current, which causes a forward voltage to be generated in the diode-connected PMOS transistor Mp5 (MOS diode D1). As a result, the voltage level of the first control signal CS1 obtained from the output node no1 of the first inverter 300 is forcibly reduced by the forward voltage. The amount of voltage drop at that time is equal to or more than the absolute value of the threshold voltage of a PMOS transistor Mp2 constituting a second inverter 200, which will be described below in detail.

The gate voltage control circuit CONT1 shown in FIG. 2B is configured by adding a PMOS transistor Mp6 to the circuit shown in FIG. 2A so as to ensure a current path separated from the diode-connected MOS transistor Mp5.

Figure 3:
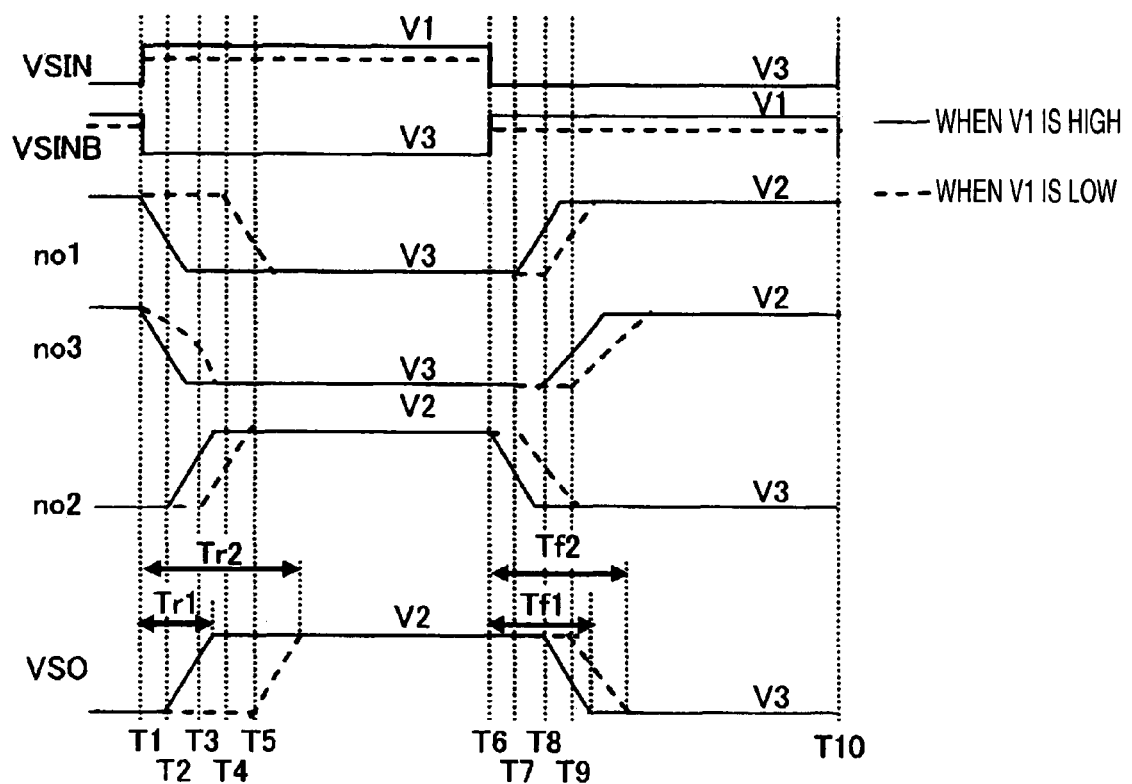
FIG. 3 is a timing chart illustrating the operation of the level shift circuit shown in FIG. 1.

Next, the operation of the level shift circuit according to this embodiment will be described with reference to FIG. 3. FIG. 3 is a timing chart illustrating the operation of the level shift circuit shown in FIG. 1.

When the difference between the voltages V2 and V1 is small, at a timing T1, if the input signal VSIN is changed from the low level to the high level, a signal VSINB is changed from the high level to the low level. As a result, the NMOS transistor Mn1 is turned on, the NMOS transistor Mn2 is turned off, and the NMOS transistor Mn5 is turned on. At this time, the PMOS transistor Mp1 is in an OFF state and the PMOS transistor Mp2 is in an OFF state. Since the difference between the drain current capability Idsn1 of the NMOS transistor Mn1 and the drain current capability Idsp1 of the PMOS transistor Mp1 (Idsn1-Idsp1) is sufficiently large, the potential of the node no1 is changed from the high level to the low level, regardless of the potential of a node no2. According to the logical inversion of the potential of the node no1, at a timing T2, the potential of an inverter INV2 is changed from the low level to the high level. At a timing T6, if the input signal VSIN is changed from the high level to the low level, the signal VSINB is changed from the low level to the high level. As a result, the NMOS transistor Mn1 is turned off, the NMOS transistor Mn2 is turned on, and the NMOS transistor Mn5 is turned off. At this time, the PMOS transistor Mp1 is in the OFF state and the PMOS transistor Mp2 is in the ON state. Since the difference between the drain current capability Idsn2 of the NMOS transistor Mn2 and the drain current capability Idsp2 of the PMOS transistor Mp2 (Idsn2-Idsp2) is sufficiently large, the potential of the node no2 is changed from the high level to the low level. According to the logical inversion of the potential of the node no2, at a timing T7, the PMOS transistor MP1 is turned on and thus the potential of the node no1 is changed from the low level to the high level. Therefore, at a timing T8, the potential of the inverter INV2 is changed from the high level to the low level.

Meanwhile, when the difference between the voltages V2 and V1 is large, at a timing T1, if the input signal VSIN is changed from the low level to the high level, the signal VSINB is changed from the high level to the low level. As a result, the NMOS transistor Mn1 is turned on, the NMOS transistor Mn2 is turned off, and the NMOS transistor Mn5 is turned on. At this time, the PMOS transistor Mp1 is in the ON state and the PMOS transistor Mp2 is in the OFF state. The difference between the drain current capability Idsn1 of the NMOS transistor Mn1 and the drain current capability Idsp1 of the PMOS transistor Mp1 (Idsn1-Idsp1) is small but nevertheless a potential, to which the potential of the node no1 is dropped down by the threshold voltage of the PMOS transistor Mp2 or more, is applied to the gate no3 of the second PMOS transistor Mp2 by the drain current of the NMOS transistor Mn5. Therefore, the PMOS transistor Mp2 is turned on so as to easily charge the node no2 with high impedance. As a result, the drain current capability Idsp1 of the PMOS transistor Mp1 becomes small and thus the drain current difference (Idsn1-Idsp1) becomes large, resulting in high speed inversion of the potential of the node no1 from the high level to the low level. According to the logical inversion of the potential of the node not, the potential of the inverter INV2 is changed from the low level to the high level. At the timing T6, if the input signal VSIN is changed from the high level to the low level, the signal VSINB is changed from the low level to the high level. As a result, the NMOS transistor Mn1 is turned off, the NMOS transistor Mn2 is turned on, and the NMOS transistor Mn5 is turned off. At this time, the PMOS transistor Mp1 is in the OFF state and the PMOS transistor Mp2 is in the ON state. If the difference between the drain current capability Idsn2 of the NMOS transistor Mn2 and the drain current capability Idsp2 of the PMOS transistor Mp2 is sufficiently ensured, the potential of the node no2 is changed from the high level to the low level. According to the logical inversion of the potential of the node no2, at the timing T7, the PMOS transistor MP1 is turned on and thus the potential of the node not is changed from the low level to the high level. Therefore, at a timing T8, the potential of the inverter INV2 is changed from the high level to the low level.

As described above, when the difference between the voltages V2 and V1 is small, a logical inversion time period is determined on the basis of the difference between the drain currents of the NMOS transistor Mn1 and the PMOS transistor Mp1 turned on and the difference between the drain currents of the NMOS transistor Mn2 and the drain current of the PMOS transistor Mp2 turned on. Meanwhile, when the difference between the voltages V2 and V1 is large, the logical inversion time period is determined on the basis of the time period in which the potential of the node no2 with high impedance is logically inverted by the NMOS transistor Mn5 through the PMOS transistor Mp2 and the difference between the drain current of the NMOS transistor Mn2 and the drain current of the PMOS transistor Mp2.

It is possible to make the size of the PMOS transistor Mp2 smaller than the PMOS transistor Mp1 and to prevent an increase in the layout area. The reason is as follows. Even when the difference between the voltages V2 and V1 is small, the PMOS transistor Mp1 requires the current capability for logically inverting the potential of the node no1 at high speed. In contrast, even when the difference between the voltages V2 and V1 is small, the PMOS transistor Mp2 can logically invert the potential of the node no1 at high speed, regardless of the current capability of the PMOS transistor Mp2. When the difference between the voltages V2 and V1 is large, the current capability of the PMOS transistor Mp2 increases according to the difference between the voltages V2 and V1, which makes it possible to easily logically invert the potential of the node no2 with high impedance and to logically invert the potential of the node no1 at high speed. For this reason, it is possible to make the size of the PMOS transistor Mp2 smaller than the PMOS transistor Mp1. Examples of the structure of the gate voltage control circuit have been described. However, the invention is not limited thereto. Any circuit having the same function as examples shown in FIGS. 2A and 2B can be applied to the invention. Also, in a case of a negative level shift circuit, a gate voltage control circuit, which has substantially the same structure as a gate voltage control circuit of a negative level shift circuit according to the related art except that the types of MOS transistors are opposite to those in the related art, can be applied.

Now, the characteristic operation of the level shift circuit shown in FIG. 1 will be described in more detail with reference to FIGS. 4 and 5.

Figure 4:
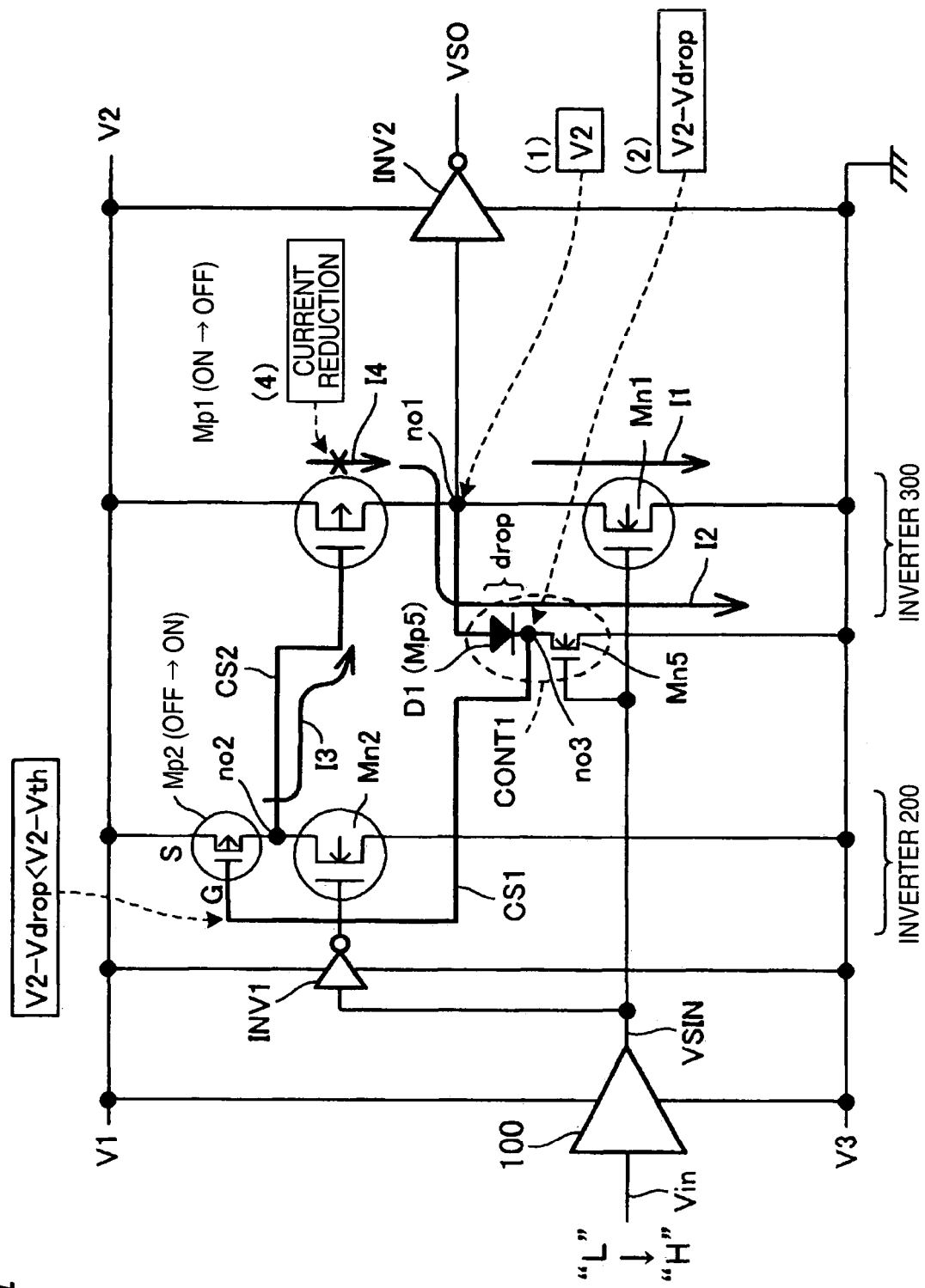
FIG. 4 is a diagram illustrating an equivalent circuit of the level shift circuit shown in FIG. 1 for facilitating the understanding of the operation of the level shift circuit shown in FIG. 1 when changing the output signal from the high level to the low level.

FIG. 4 is a diagram illustrating an equivalent circuit of the level shift circuit shown in FIG. 1 for facilitating the understanding of the operation of the level shift circuit shown in FIG. 1 when changing the output signal from the high level to the low level.

The circuit shown in FIG. 4 is completely the same as the circuit shown in FIG. 1. However, in FIG. 4, the circuit is illustrated considering a single-ended output type level shifter circuit generating one output signal in response to an input signal. Further, the level shift circuit is devised such that it can be easily understood that the circuit is formed by combining a plurality of inverters. Furthermore, characteristic points of main operations when the output signal is changed from the high level to the low level are denoted by reference symbols (1) to (4).

Figure 20:
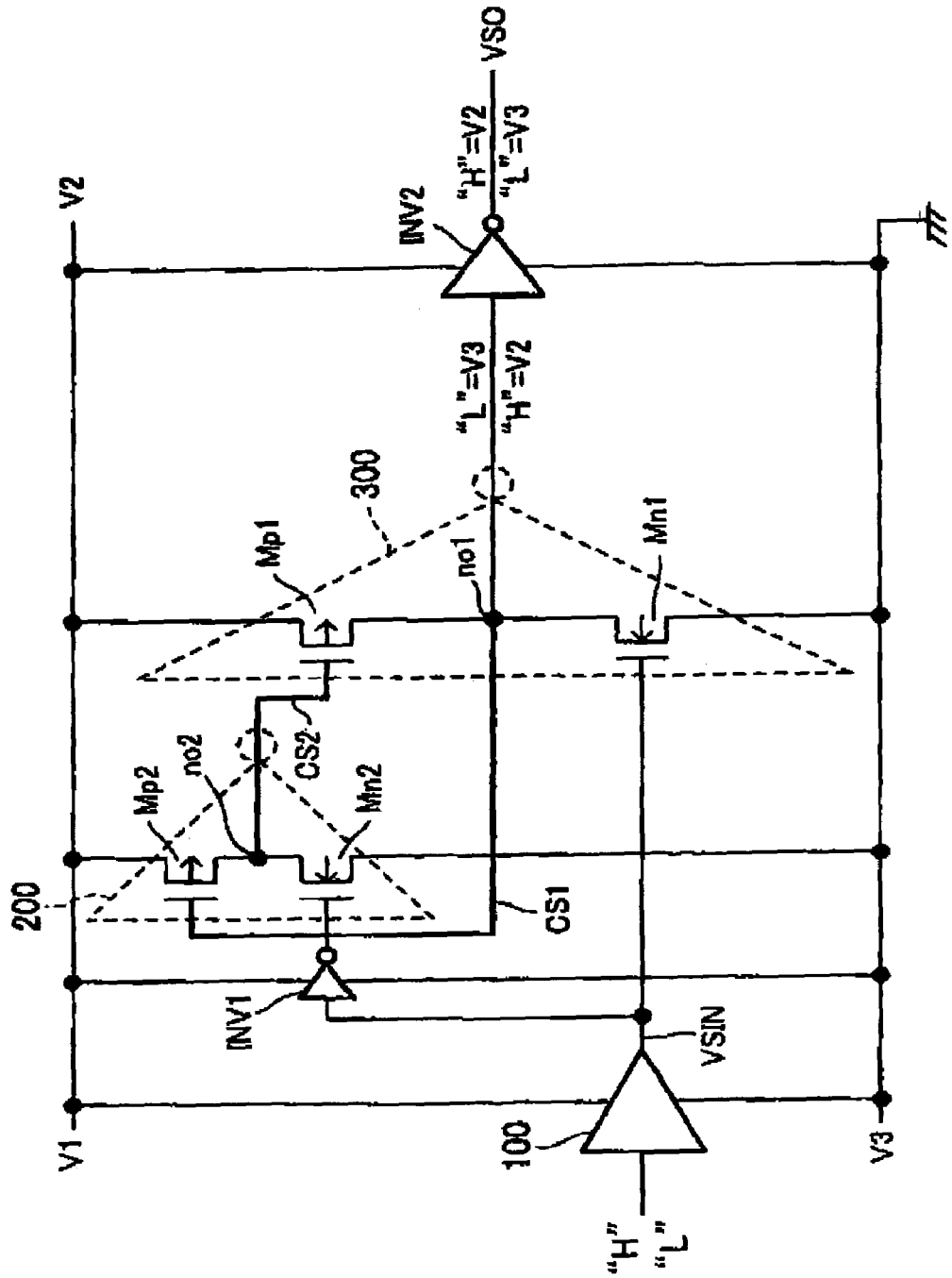
FIG. 20 is a diagram illustrating an equivalent circuit of the level shift circuit shown in FIG. 18 for facilitating the understanding of the basic structure and operation of the level shift circuit shown in FIG. 18.

Also, in FIG. 4, the size of each transistor is emphasized and thus it is clarified that the size of the NMOS transistor Mn1 shown in FIG. 4 is larger than the NMOS transistor Mn1 shown in FIG. 20 and the size of the PMOS transistor Mp2 shown in FIG. 4 is scaled down.

The above-mentioned main operations will described below with reference to FIG. 4.

When the input signal VSIN is changed from the low level to the high level, the NMOS transistor Mn1 is turned on to pull a current I1. In this case, when the amount of current is small, the change of the output signal from the high level to the low level is delayed. However, this delay is minimized in the circuit shown in FIG. 4. In other words, when the input signal VSIN is changed from the low level to the high level, the voltage of the output node no1 becomes V2 (a state (1) in FIG. 4) and the MOS diode D1 drops down the voltage V2 by a forward voltage Vdrop (a state (2) in FIG. 4). If the amount of voltage drop Vdrop is set to be equal to or more than the absolute value of the threshold voltage Vth of the PMOS transistor Mp2, the gate potential of the PMOS transistor Mp2 falls by the threshold voltage Vth or more as seen from the source potential V2 (a state (3) in FIG. 4). Therefore, the PMOS transistor Mp2 is turned on, and the PMOS transistor Mp1 is driven. At this time, since the NMOS transistor Mn2 is in an OFF state, if necessary, the PMOS transistor Mp2 may do nothing other than allowing a current I3 capable of the gate of the PMOS transistor Mp1 to flow therethrough, resulting in a reduction in the size of the transistor. When the gate potential of the PMOS transistor Mp1 rises, a current I4 is reduced (a state (4) in FIG. 4). In other words, even when the current capability of the NMOS transistor Mn1 is reduced, since the current I4 pushed from the upside is reduced, no problem occurs. As described above, since it is possible to instantaneously reduce the current pushed from the upside by the control of the circuit, it is unnecessary to increase the size of the NMOS transistor Mn1 so much (it is possible to make the size of the NMOS transistor Mn1 smaller than the size of the transistor shown in FIG. 20). Further, it is possible to minimize the size of the PMOS transistor Mp2 and to suppress the increase in the area occupied by the circuit.

Figure 5:
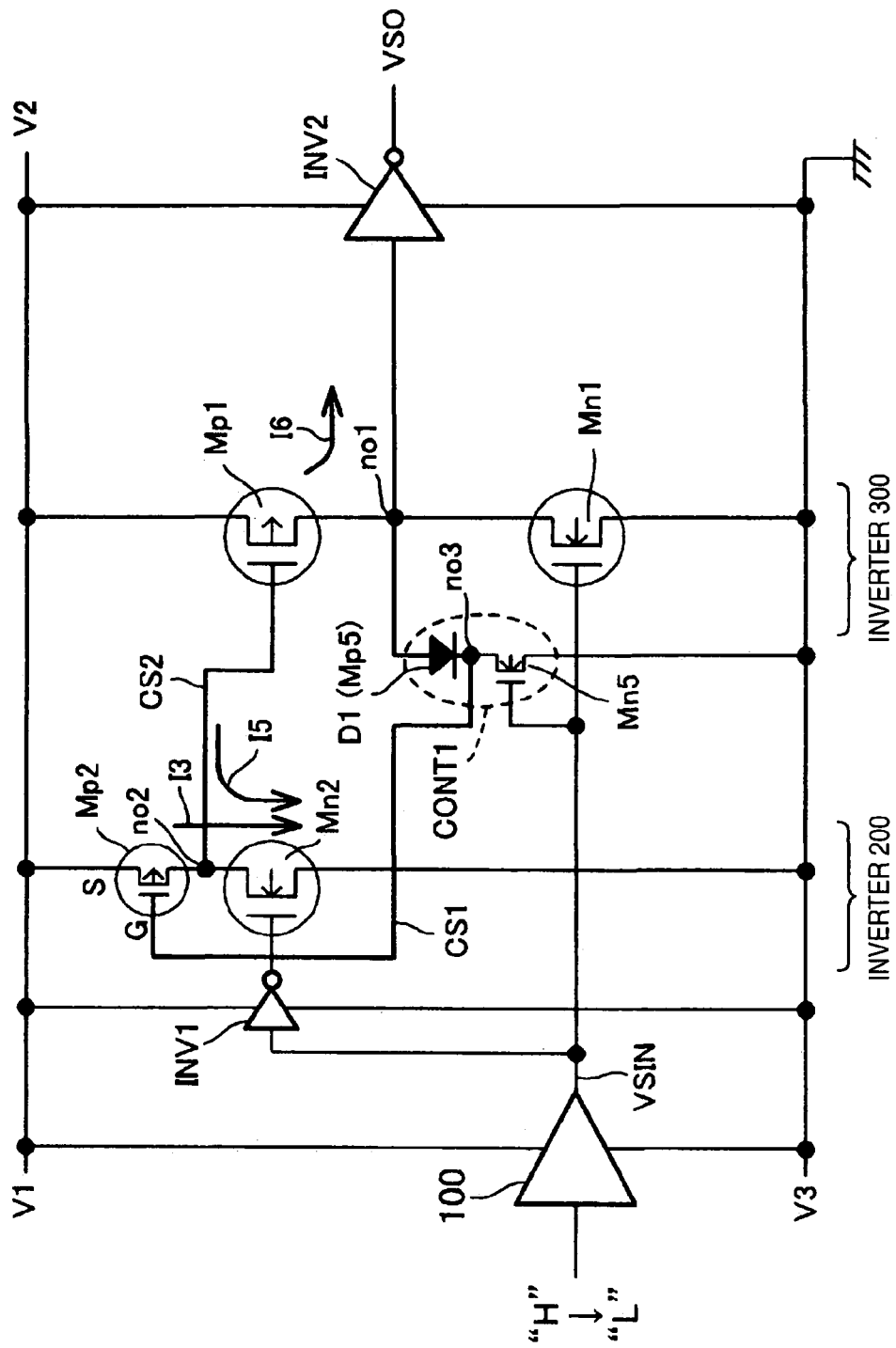
FIG. 5 is a diagram illustrating an equivalent circuit of the level shift circuit shown in FIG. 1 for facilitating the understanding of the operation of the level shift circuit shown in FIG. 1 when the output signal is changed from the low level to the high level.

FIG. 5 is a diagram illustrating an equivalent circuit of the level shift circuit shown in FIG. 1 for facilitating the understanding of the operation of the level shift circuit shown in FIG. 1 when the output signal is changed from the low level to the high level.

Main operations of the circuit shown in FIG. 5 will now be described. When the input signal is changed form the high level to the low level, the NMOS transistor Mn2 driven by the inverter INV1 is turned on. Since the current capability of the NMOS transistor Mn2 is sufficiently larger than the current capability of the PMOS transistor Mp2, even when the current I3 is pushed from the PMOS transistor Mp2 to the NMOS transistor Mn2, the NMOS transistor Mn2 can pull a sufficient amount of current I5, regardless of the current I3. Therefore, the PMOS transistor Mp1 is quickly turned on, and thus the potential of the output node no1 can be rapidly raised by a current I6. Therefore, no problem occurs.

Second Embodiment

Next, a second embodiment of the invention will be described.

Figure 6:
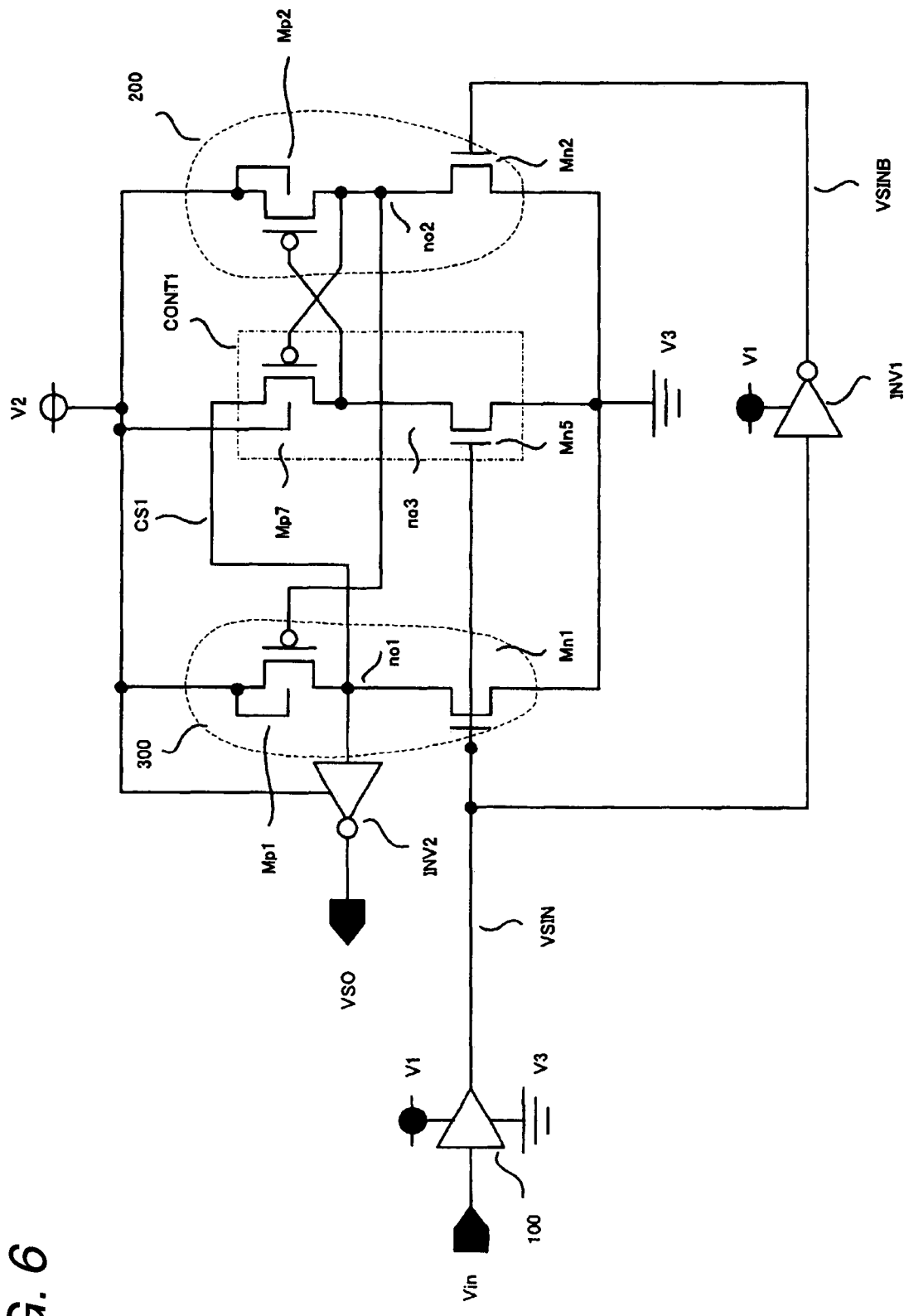
FIG. 6 is a diagram illustrating a level shift circuit according to a second embodiment of the invention.

The second embodiment is a modification of the level shift circuit according to the first embodiment shown in FIGS. 1 and 2, and an equivalent circuit of the second embodiment is shown in FIG. 6.

In FIG. 6, the same components as those in the level shift circuit shown in FIG. 1 have the same reference symbols. The level shift circuit according to the second embodiment has the same basic structure as the level shift circuit shown in FIG. 1.

The level shift circuit according to the second embodiment has the same structure as the first embodiment except that the level shift circuit according to the second embodiment uses a PMOS transistor Mp7 whose gate electrode is connected to the source electrode of the PMOS transistor Mp2 of the inverter 200 and whose source electrode is connected to the gate electrode of the PMOS transistor Mp2 of the inverter 200 as shown in FIG. 6, instead of the diode-connected PMOS transistor Mp5 of the gate voltage dropping circuit CONT1 in the first embodiment shown in FIG. 2.

That is, the gate voltage dropping circuit CONT1 shown in FIG. 6 is composed of the PMOS transistor Mp7 and the NMOS transistor Mn5 driven by the input signal VSIN.

In the gate voltage dropping circuit CONT1, when the input signal VSIN is changed from the low level to the high level, the NMOS transistor Mn5 is turned on to pull a current, which causes a forward voltage to be generated in the diode-connected PMOS transistor Mp7. As a result, the voltage level of the control signal CS1 obtained from the output node no1 of the first inverter 300 is forcibly reduced by the forward voltage.

That is, when the input signal VSIN is changed from the low level to the high level, the NMOS transistor Mn1 is turned on to pull the current I1. In this case, if the amount of current I1 is small, the change of the output signal from the high level to the low level is delayed. However, this delay is minimized in this circuit. In other words, when the input signal VSIN is changed from the low level to the high level, the voltage of the output node no1 becomes V2 and the MOS diode D1 drops down the voltage V2 by a forward voltage Vdrop. In this case, in this embodiment, since the gate electrode of the PMOS transistor Mp7 is connected to the source electrode of the PMOS transistor Mp2 of the second inverter and the source electrode of the PMOS transistor Mp7 is connected to the gate electrode of the PMOS transistor Mp2 of the second inverter, the voltage of the output node no2 corresponding to an input terminal of the first inverter 300 is changed from V1 to V2, whereby the voltage $V_{GS}$ between the gate and source of the PMOS transistor Mp7 becomes small. Therefore, it is possible to suppress the amount of current flowing through the MOS transistors Mp1, Mp7, and Mn5 at the time of the logic inversion.

According to this structure, it is possible to reduce power consumption by suppressing the amount of current.

Further, in this embodiment, when a well of the PMOS transistor Mp7 of the gate voltage dropping circuit CONT1 is set to V2, it is possible to increase the on-resistance of the PMOS transistor Mp7 by a substrate bias effect and to increase the logic inversion speed.

The sizes of the PMOS transistor Mp2 and the PMOS transistor Mp1 can make the current capability of the PMOS transistor Mp2 lower than that of the PMOS transistor Mp1 on the basis of the following reason and can suppress an increase in a layout area. The reason why is as follows. Even when the difference V2-V1 is small, the PMOS transistor Mp1 needs current capability in order to logically invert the voltage of the output node no1 at a high speed, while the PMOS transistor Mp2 can logically invert the voltage of the output node no1 at a high speed regardless of the current capability of the PMOS transistor Mp2. Further, when the difference V2-V1 is large, it is possible to increase the current capability of the PMOS transistor Mp2 according to the difference V2-V1, to easily logically invert the voltage of the output node no2 being in a high-impedance state, and to logically invert the voltage of the output node no1 at a high speed. For this reason, it is possible to make the size of the PMOS transistor Mp2 smaller than the PMOS transistor Mp1.

This structure of the gate voltage dropping circuit is just an illustrative example and any circuit having the same function as examples shown in FIGS. 2A and 2B can be applied to the invention. Also, in a case of a negative level shift circuit, a gate voltage control circuit, which has substantially the same structure as a gate voltage control circuit of a negative level shift circuit according to the related art except that the types of MOS transistors are opposite to those in the related art, can be applied.

Third Embodiment

Next, a third embodiment of the invention will be described.

Figure 7:
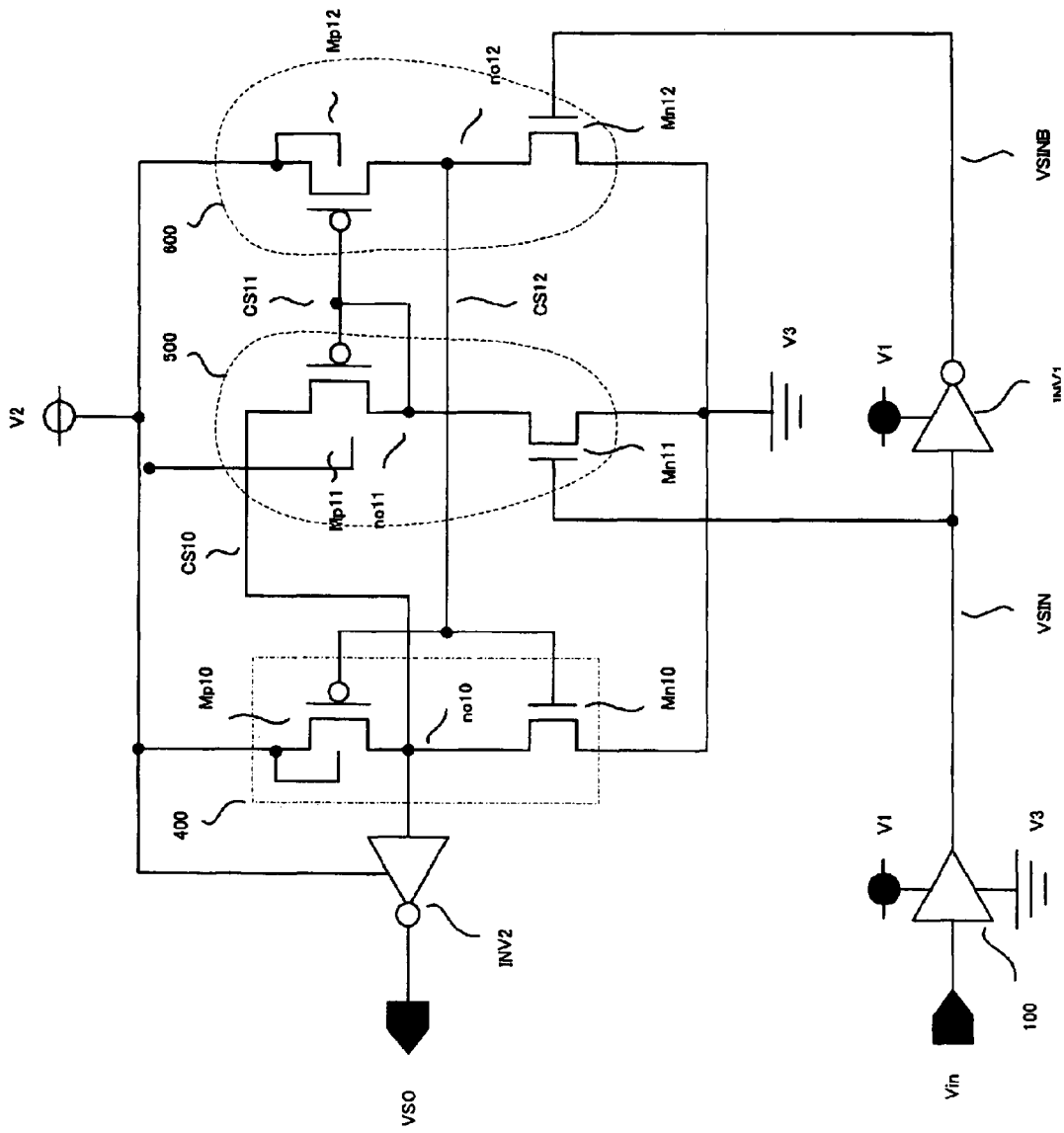
FIG. 7 is a diagram illustrating a level shift circuit according to a third embodiment of the invention.
Figure 8:
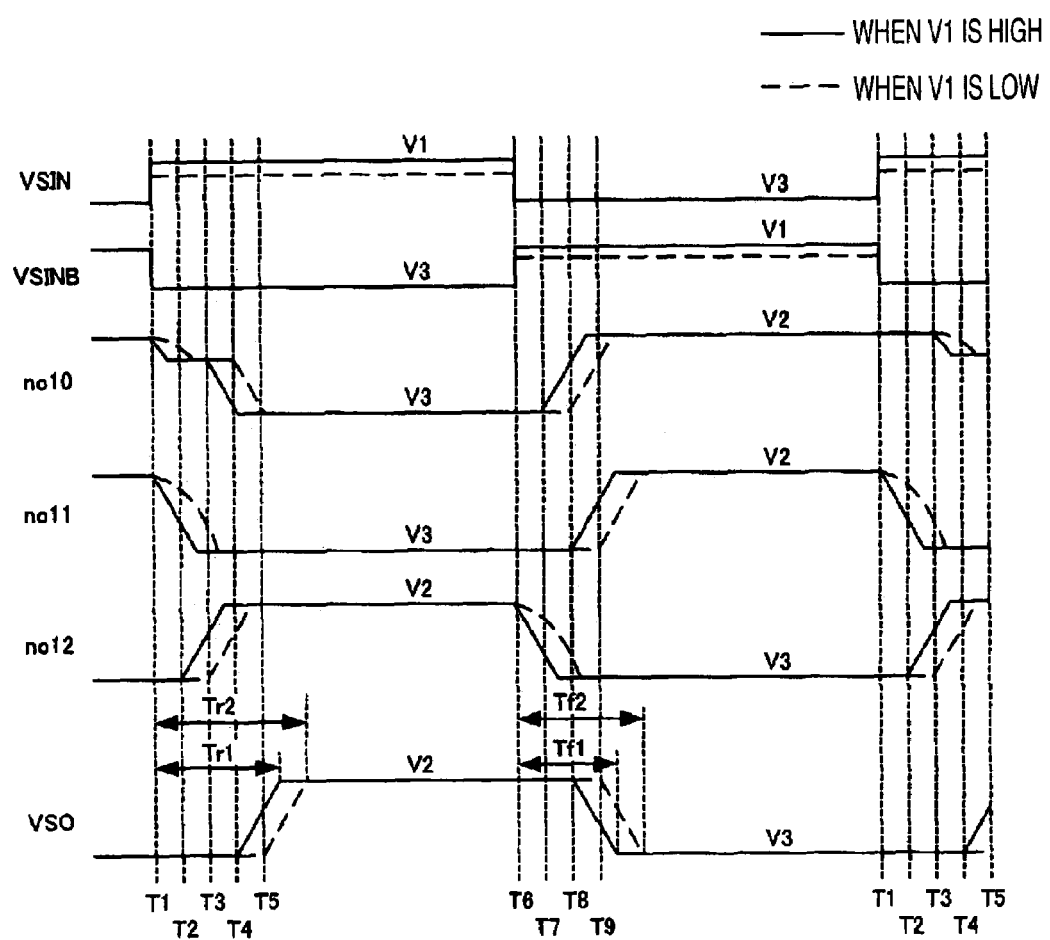
FIG. 8 is a timing chart illustrating the operation of the level shift circuit shown in FIG. 7.

The third embodiment is a modification of the level shift circuit according to the first embodiment shown in FIGS. 1 and 2. FIG. 7 is a diagram illustrating an equivalent circuit of the third embodiment and FIG. 8 is a diagram illustrating the flow of the operation of the third embodiment.

In FIG. 7, the same components as those in the level shift circuit shown in FIG. 1 have the same reference symbols. A level shift circuit according to the third embodiment has the same basic structure as the level shift circuit shown in FIG. 1.

A level shift circuit according to this embodiment includes a fifth inverter 500 and a sixth inverter 600, and a power supply source for the inverter 500 is set to a midpoint potential between the potentials of logic elements constituting an output inverter 400.

Referring to FIG. 7, in this embodiment, the logic elements constituting the output inverter 400 includes a PMOS transistor Mp10 and an NMOS transistor Mn10, similar to the first inverter 300. The gate of the NMOS transistor Mn10 and the gate of the PMOS transistor Mp 10 are connected to an output node 12 and a power supply is connected to the source electrode of the fifth inverter 500.

Here, the inverter 400 is used as an output circuit of the level shift circuit and as the power supply for the inverter 500 and is also used as an element for accelerating the inversion speed of the level shift circuit.

A logic circuit (inverter 400) shown in FIG. 7 is composed of the PMOS transistor Mp10 and the NMOS transistor Mn10.

Further, the fifth inverter 500 is composed of a PMOS transistor Mp11 and an NMOS transistor Mn11.

Furthermore, the sixth inverter 600 is composed of a PMOS transistor Mp12 and an NMOS transistor Mn12.

In the logic circuit 400, when the input signal VSIN is changed from the low level to the high level, the NMOS transistor Mn10 is turned on to pull a current, which causes a forward voltage to be generated in the PMOS transistor Mp10 and the diode-connected PMOS transistor Mp11 (MOS diode D1). Therefore, the voltage levels of a control signal CS10 obtained from an output node no10 of the logic circuit 400 and a control signal CS11 obtained from an output node no11 of the fifth inverter 500 are forcibly reduced by the forward voltage. At this time, the amount of voltage drop is equal to or more than the absolute value of the threshold voltage of the PMOS transistor Mp12 constituting the sixth inverter 600.

Next, the operation of the level shift circuit according to this embodiment will be described with reference to FIG. 8. FIG. 8 is a timing chart illustrating the operation of the level shift circuit shown in FIG. 7. This timing chart shows the flow of the operation when the voltage V1 is low and when the voltage V1 is high and when and the flow of the operation when the voltage V1 is low in the timing chart of the first embodiment shown in FIG. 3.

When the difference V2-V1 is small, at a timing T1, when the input signal VSIN is changed from the low level to the high level, the signal VSINB is changed from the high level to the low level. As a result, the NMOS transistor Mn11 is turned on. At this time the PMOS transistor Mp10 is in the ON state and the PMOS transistor Mp11 is in the ON state. Since the NMOS transistor Mn11 is turned on, the potential of the output node no10 of the logic circuit 400 is reduced and the potential of the output node no11 is reduced. Therefore, the PMOS transistor Mp12 is turned on such that the voltage of the output node no12 is changed from the low level to the high level. According to the logical inversion of the potential of the node no21, at a timing T2, the potential of the inverter INV2 is changed from the low level to the high level. Further, at a timing T6, when the input signal VSIN is changed from the high level to the low level, the signal VSINB is changed from the low level to the high level. Accordingly, the NMOS transistor Mn11 is turned off. At this time, the PMOS transistor Mp10 is in an OFF state and the PMOS transistor Mp11 is in an ON state. Since the difference between the drain current capability Idsn12 of the NMOS transistor Mn12 and the drain current capability Idsp12 of the PMOS transistor Mp12 (Idsn12-Idsp12) is sufficiently large, the potential of the node no12 is changed from the high level to the low level. According to the logical inversion of the potential of the output node no12, at a timing T7, the PMOS transistor Mp11 is turned on such that the potential of the output node no11 is changed from the low level to the high level. Therefore, at a timing T8, the potential of an inverter INV2 is changed from the high level to the low level.

Even when the difference V2-V1 is large, since the on-resistance of these PMOS transistors Mp10 and Mp11 is sufficiently large, the potential of the output node no12 is changed from the high level to the low level regardless of the potential of the output node no11. Therefore, the level shift circuit performs the same operation as that when the difference V2-V1 is small.

As described above, when the difference V2-V1 is small, the time it takes for the logical inversion is determined according to a difference between the drain currents of the transistors Mn11 and Mp11 turned on and a difference between the drain currents of the transistors Mn12 and Mp12. Further, when the difference V2-V1 is large, since the on-resistance of the PMOS transistors Mp10 and Mp11 is sufficiently large, the potential of the output node no12 is changed from the low level to the high level, regardless of the potential of the output node no11.

The sizes of the PMOS transistor Mp12 and the PMOS transistor Mp12 can make the current capability of the PMOS transistor Mp11 lower than that of the PMOS transistor Mp12 on the basis of the following reason and can suppress an increase in a layout area. The reason why is as follows. Even when the difference V2-V1 is small, the PMOS transistor Mp12 needs current capability in order to logically invert the voltage of the output node no11 at a high speed, while the PMOS transistor Mp11 can logically invert the voltage of the output node no11 at a high speed regardless of the current capability of the PMOS transistor Mp11. Further, when the difference V2-V1 is large, it is possible to reduce the potential of the output node no11 using the on-resistance of the PMOS transistors Mp10 and Mp11, to increase the current capability of the PMOS transistor Mp12, to easily logically invert the voltage of the output node no12 being in a high-impedance state, and to logically invert the voltage of the output node no12 at a high speed. For this reason, it is possible to make the size of the PMOS transistor Mp11 smaller than the PMOS transistor Mp12.

Further, if the wells of the transistors Mp11 and Mp12 are set to the voltage V2, both the wells can be shared and the occupying area can be reduced. Furthermore, due to the substrate bias effect, it is possible to increase the on-resistance of the PMOS transistor Mn12 and to increase the logic inversion speed.

Fourth Embodiment

Next, a fourth embodiment of the invention will be described.

The fourth embodiment is a modification of the level shift circuit according to the third embodiment shown in FIGS. 7 and 8.

Figure 9:
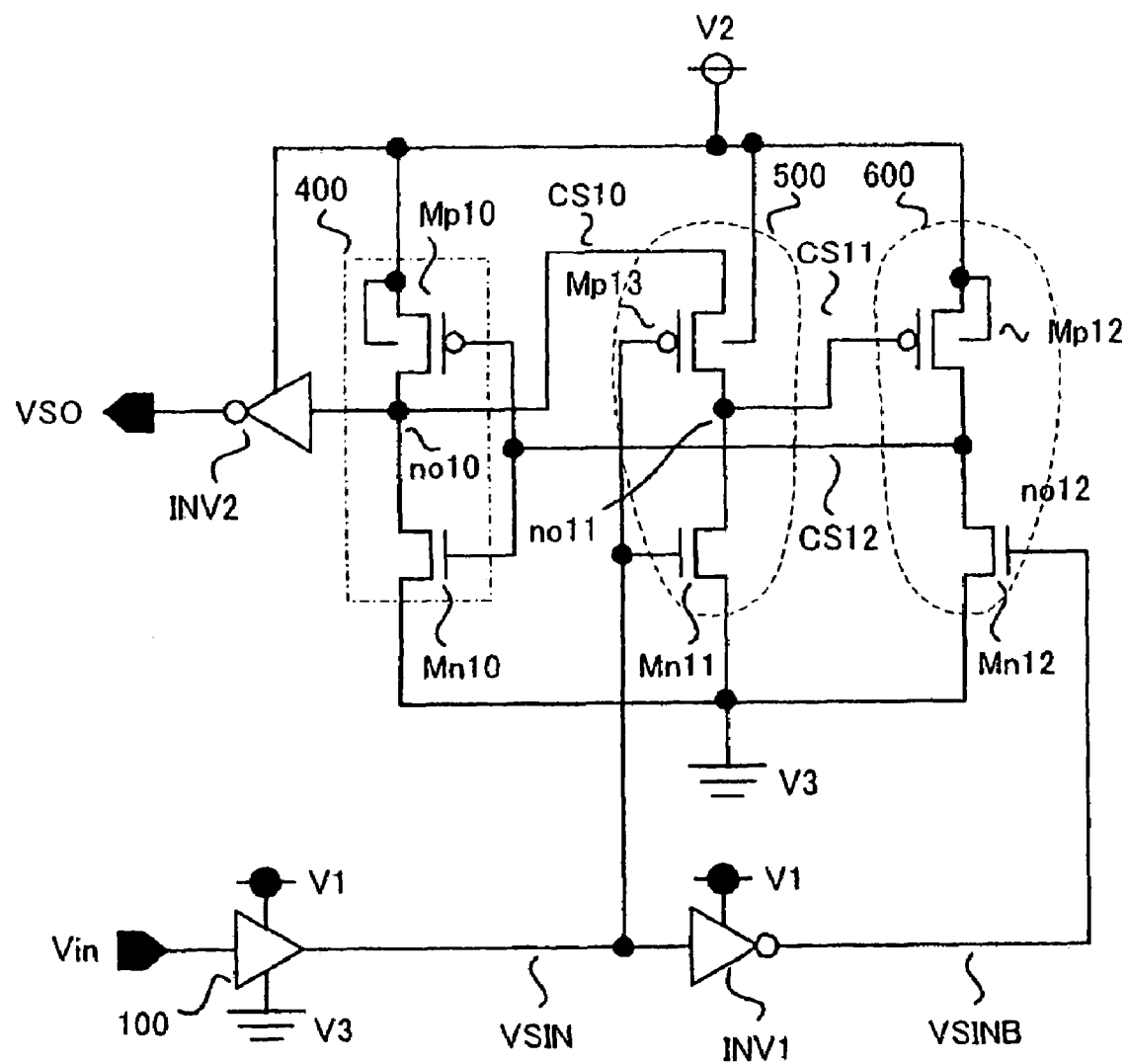
FIG. 9 is a diagram illustrating a level shift circuit according to a fourth embodiment of the invention.

FIG. 9 is a diagram illustrating a level shift circuit according to the fourth embodiment.

In FIG. 9, the same components as those of the level shift circuit shown in FIG. 7 are denoted by the same reference symbols. The fourth embodiment has the same basic circuit structure as the level shift circuit shown in FIG. 7.

The level shift circuit according to the fourth embodiment has the same structure as the level shift circuit according to the third embodiment except that the gate of the transistor Mp11 of the fifth inverter 500 is connected to the input buffer so as to be capable of receiving the input signal VSIN and this transistor is referred to as a (thirteenth) transistor Mp13.

According to this structure, when the potential difference V2-V1 is small and the input signal VSIN is changed form the low level to the high level, since the on-resistance of the transistor Mp13 increases, it is possible to increase the speed at which the potential of the output node no11 is inverted.

Therefore, according to the above-mentioned structure, in addition to the effects of the third embodiment, when the potential difference V2-V1 is small, it is possible to increase the rising speed and the falling speed.

Fifth Embodiment

Next, a fifth embodiment of the invention will be described.

This embodiment is another modification of the level shift circuit according to the third embodiment shown in FIGS. 7 and 8.

Figure 10:
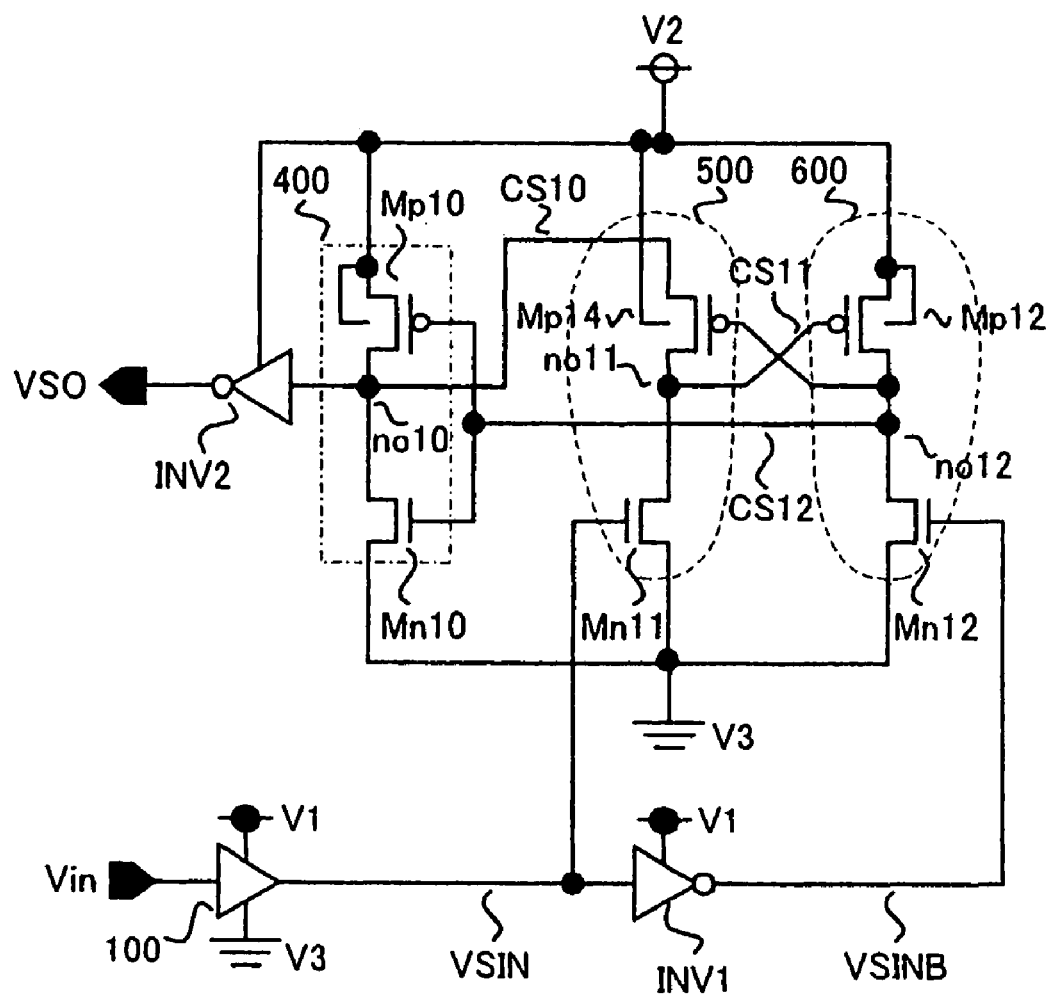
FIG. 10 is a diagram illustrating an example in which a NOR circuit is used as output of a level shift circuit according to a fifth embodiment of the invention.

FIG. 10 is a diagram illustrating a level shift circuit according to the fifth embodiment.

In FIG. 10, the same components as those of the level shift circuit shown in FIG. 7 are denoted by the same reference symbols. The fifth embodiment has the same basic structure as the level shift circuit shown in FIG. 7.

The level shift circuit according to the fifth embodiment has the same structure as the level shift circuit according to the third embodiment except that the gate of the transistor Mp11 of the fifth inverter 500 is connected to the output node no12 so as to be driven by the terminal potential of the output node no12 and this transistor is referred to as a (fourteenth) transistor Mp14.

According to this structure, when the potential difference V2−V1 is small and the input signal VSIN is changed from the low level to the high level, the potential of the output node no12 is changed from V1 to V2. Accordingly, the voltage $V_{GS}$ between the gate and source of the transistor Mp14 decreases and the amount of source-drain current is reduced.

According to the above-mentioned structure, in addition to the effects of the third embodiment, it is possible to suppress the current flowing through the transistors Mp10, Mp14, and Mn11 and to reduce the power consumption.

Sixth Embodiment

Next, a sixth embodiment of the invention will be described.

Figure 11:
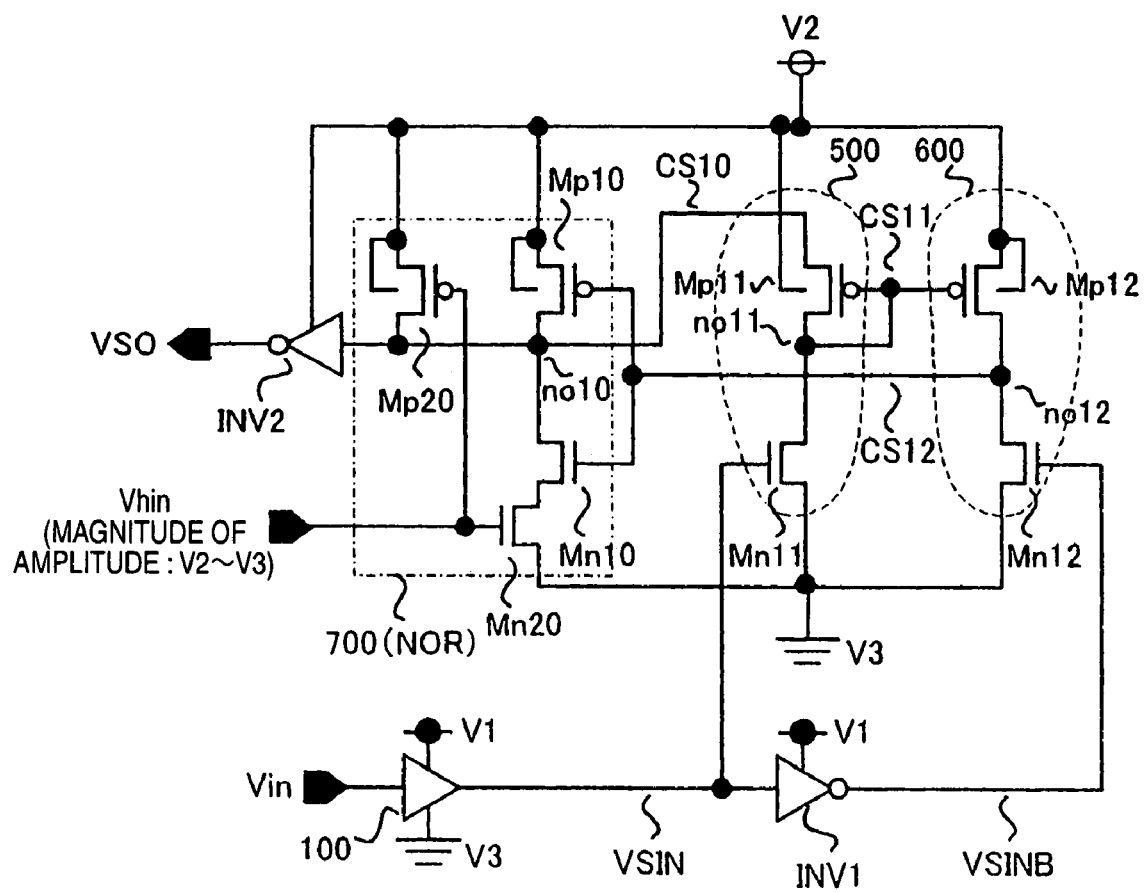
FIG. 11 is a diagram illustrating an example in which a NAND circuit is used as output of a level shift circuit according to a sixth embodiment of the invention.

In this embodiment, as shown in FIG. 11, the output of the level shift circuit according to the second embodiment of the invention is used as a logic circuit in a NOR circuit 700. The level shift circuit performs the same operation as the second embodiment and thus a description thereof will be omitted.

According to this structure, the operation can be performed at a high speed while suppressing an increase in the power consumption. Further, it is possible to provide a NOR circuit having high reliability without increasing a chip area.

Seventh Embodiment

Next, a seventh embodiment of the invention will be described.

Figure 12:
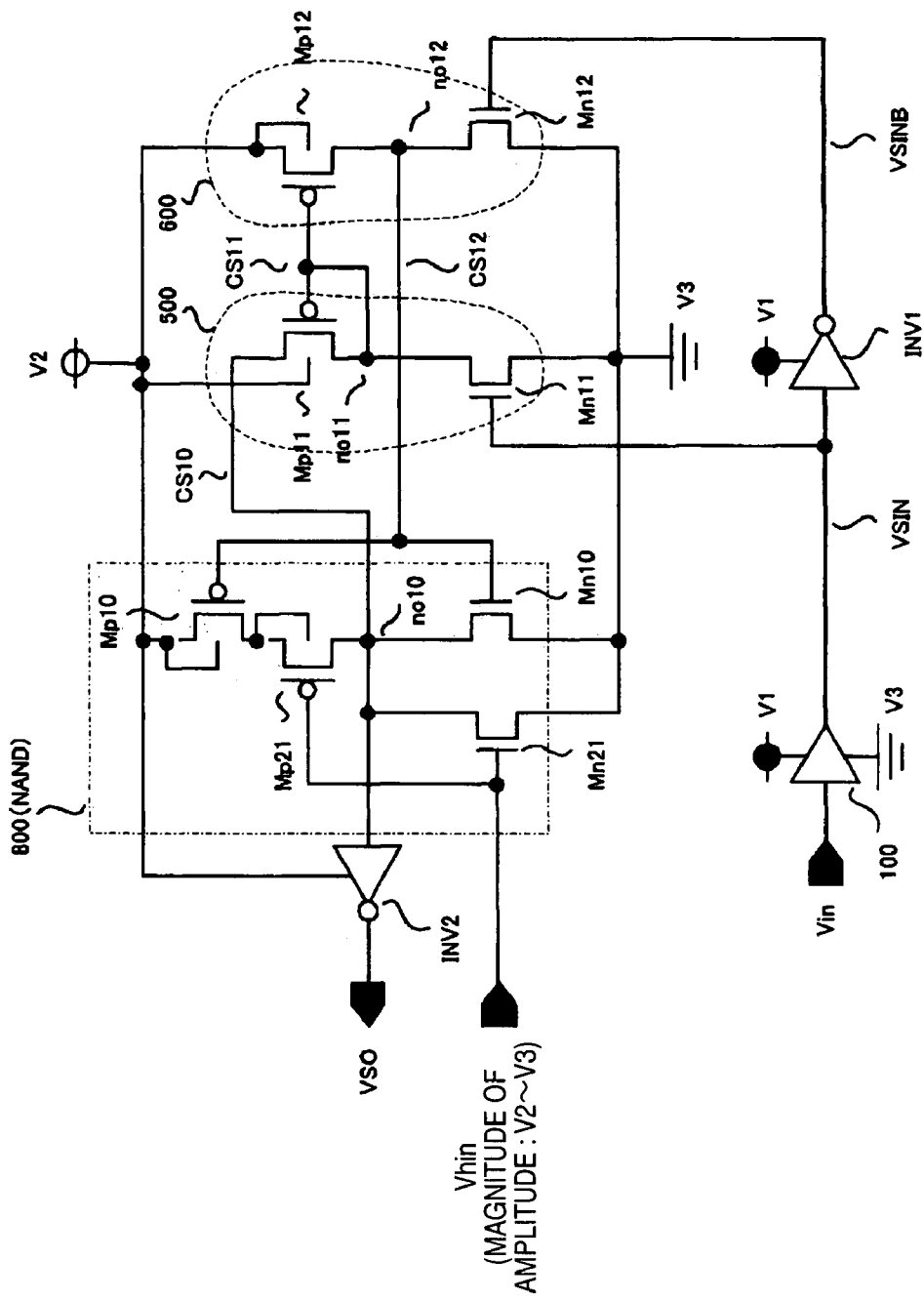
FIG. 12 is a diagram illustrating a level shift circuit according to a seventh embodiment of the invention.

In this embodiment, as shown in FIG. 12, the output of the level shift circuit according to the second embodiment of the invention is used as a logic circuit in a NAND circuit 800. The level shift circuit performs the same operation as the second embodiment and thus a description thereof will be omitted.

According to this structure, it is possible to suppress an increase in the power consumption. Further, it is possible to provide a NAND circuit capable of operating at a high speed without increasing a chip area.

Eighth Embodiment

As described above, the level shift circuit according to the embodiment of the invention can suppress an increase in the delay time regardless of the difference between the voltages V2 and V1. Therefore, when using the level shift circuit as a clock generating circuit 901 of a voltage booster circuit shown in FIG. 13, it is possible to ensure a timing margin of a voltage boosting cell 902 and to prevent a reduction in a voltage boosting capability.

Hereinafter, a case when using the level shift circuit as a clock generating circuit will be described in detail.

Figure 13:
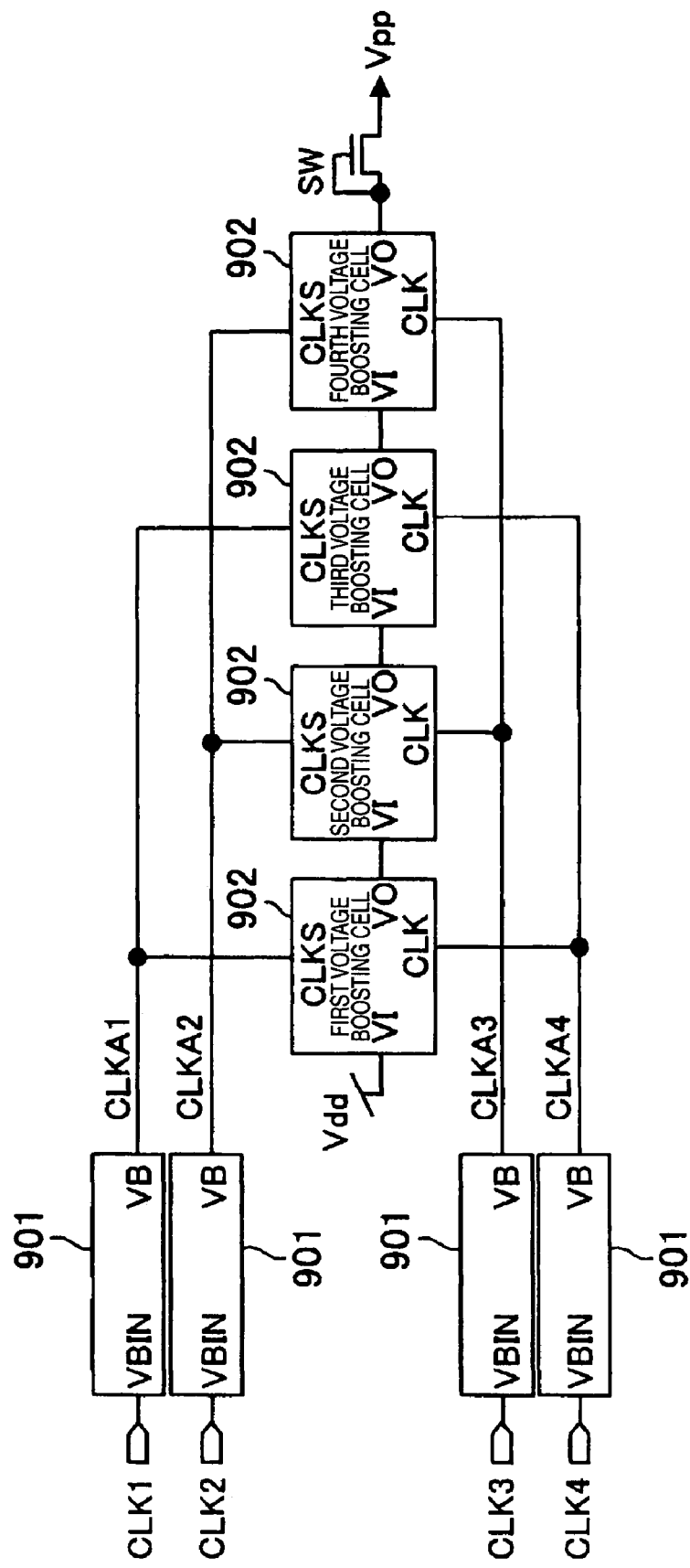
FIG. 13 is a circuit diagram illustrating the structure of an example of a voltage booster circuit using a level shift circuit according to an embodiment of the invention as a four-phase clock signal generating circuit.

FIG. 13 is a circuit diagram illustrating the structure of an example of a voltage booster circuit using the level shift circuit according to the embodiment of the invention as a four-phase clock generating circuit.

In FIG. 13, reference symbols CLK1 to CLK4 indicate original clock signals (generated in the low voltage circuit), and reference numeral 901 indicates a four-phases clock generating circuit using the level shift circuit according to the embodiment of the invention. Reference numeral 902 indicates a voltage boosting cell. A reference symbol SW indicates a rectifying device.

The four-phase clock generating circuits 901 convert four-phase clocks from the voltage level V1 to the voltage level V2 and supply the converted clocks to the voltage boosting cells 902. Each of the voltage boosting cells 902 pumps up the voltage level from the previous stage to the next stage according to the output of the four-phase clock generating circuit 901.

Figure 14:
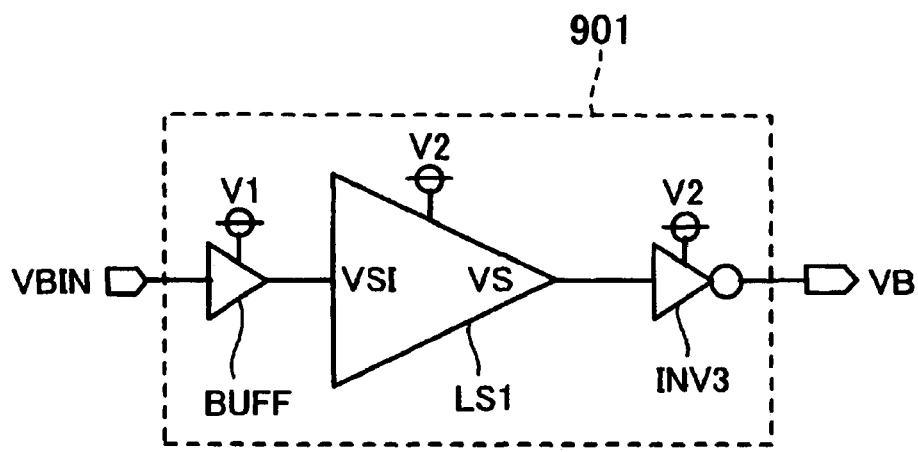
FIG. 14 is a circuit diagram illustrating the internal structure of the four-phase clock signal generating circuit shown in FIG. 13.

FIG. 14 is a circuit diagram illustrating the internal structure of the four-phase clock generating circuit shown FIG. 13. As shown in FIG. 14, the four-phase clock generating circuit 901 includes a buffer circuit BUFF driven at the voltage level V1, a level shift circuit LS1 converting the voltage level from V1 to V2, and an inverter circuit INV3.

Figure 15:
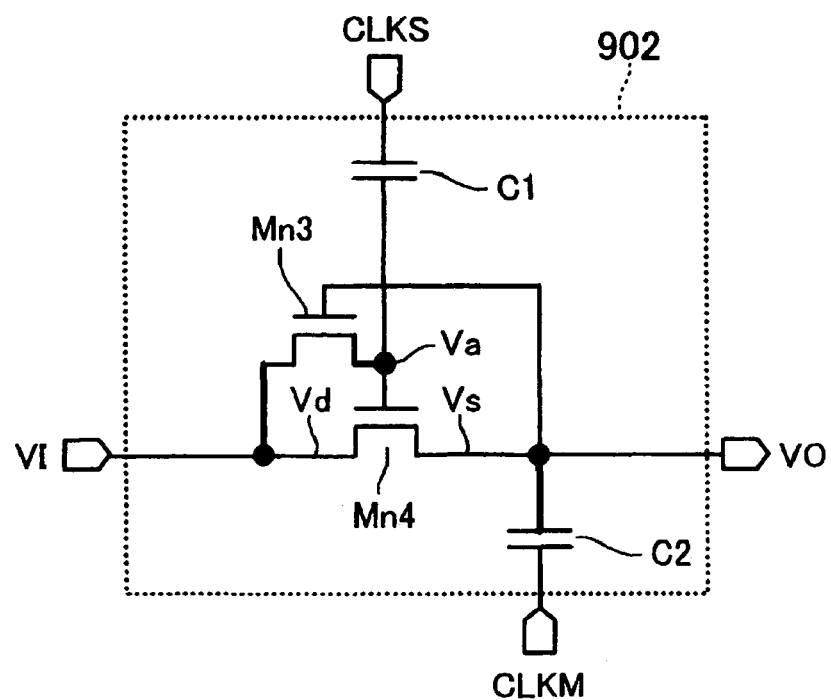
FIG. 15 is a circuit diagram illustrating the internal structure of a voltage boosting cell shown in FIG. 13.

FIG. 15 is a circuit diagram illustrating the internal structure of the voltage boosting cell shown in FIG. 13. As shown in FIG. 15, the voltage boosting cell 902 includes a charge transfer transistor Mn4, a switching transistor Mn3 short-circuiting the drain and gate of the charge transfer transistor Mn4 according to the four-phase clocks, a sub-pumping capacitor C1 pumping the gate of the charge transfer transistor to turn on the charge transfer transistor, and a pumping capacitor C2 pumping up a source potential according to the four-phase clock after the charge transfer from the drain to source of the charge transfer transistor is performed.

Figure 16:
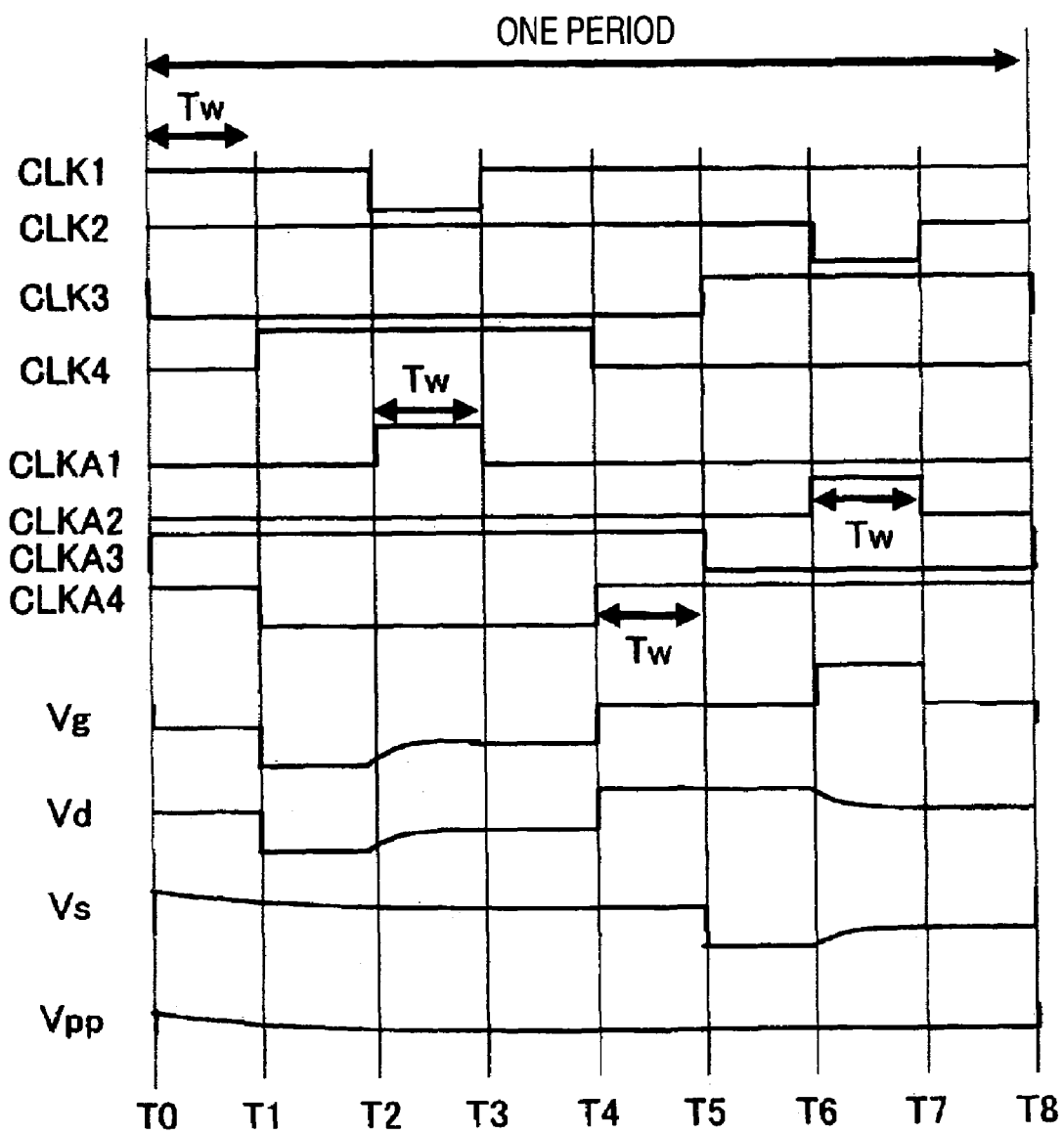
FIG. 16 is a timing chart illustrating the operation of a voltage booster circuit according to an embodiment of the invention.

The operation of the voltage booster circuit having the above-mentioned structure will be described with reference to FIG. 16. FIG. 16 is a timing chart illustrating the operation of the voltage booster circuit according to this embodiment of the invention.

The four-phase clocks CLK1 to CLK4 are logically inverted with a predetermined delay time Tw set thereto. Not only when the difference between the voltage levels V2 and V1 of the power voltages is small but also when the difference between the voltage levels V2 and V1 is large, the delay time Tw set to the four-phase clocks CLK1 to CLK4 is substantially maintained even in the output signal of the level shift circuit LS1. Therefore, the voltages Vg, Vd, and Vs of the voltage boosting cells are controlled and a voltage boosting operation is performed while ensuring the timing margin.

Figure 17:
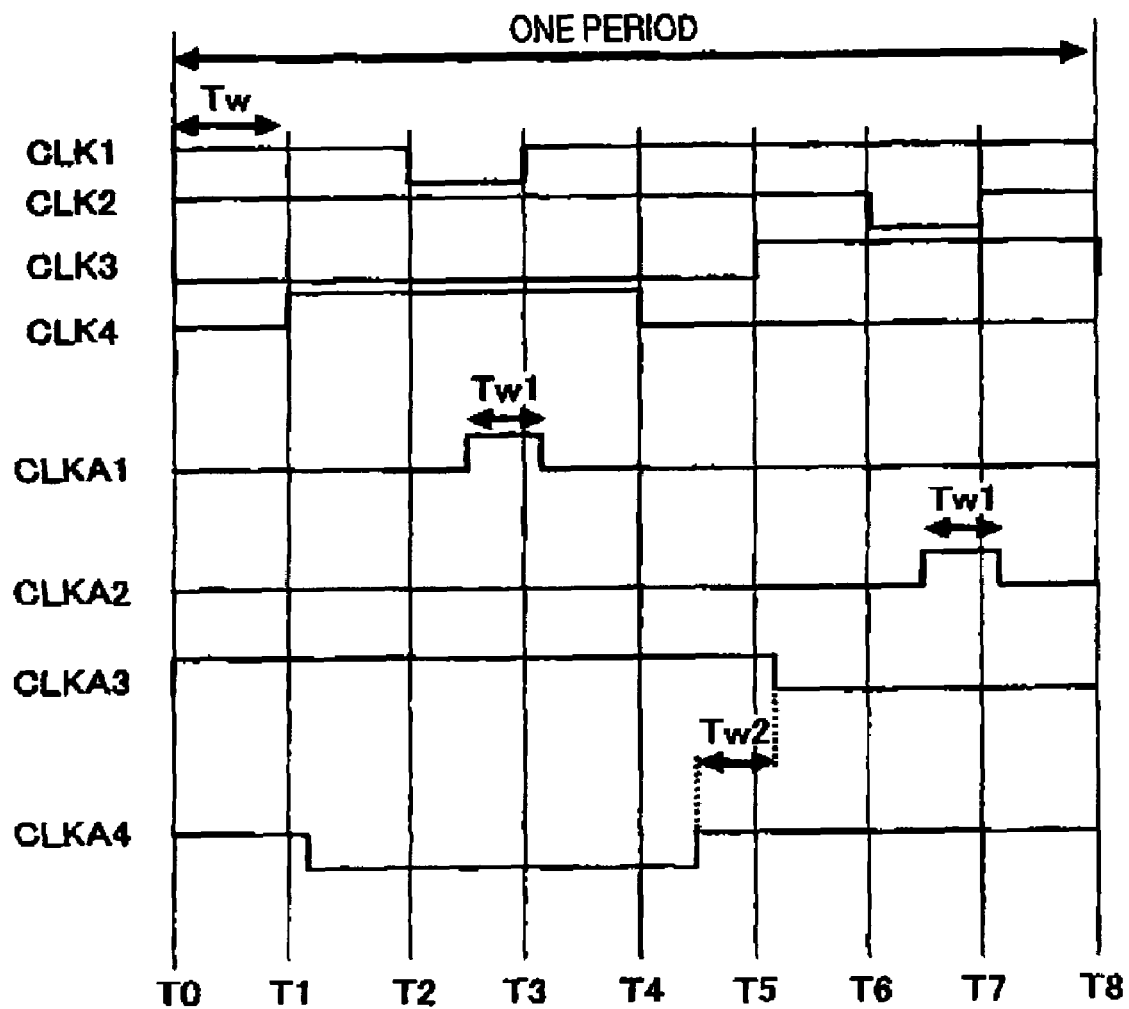
FIG. 17 is a timing chart illustrating the operation of a voltage booster circuit (a comparative example), using a level shift circuit according to the related art (see FIG. 18) as a four-phase clock generating circuit, when a difference V2-V1 between voltage levels V2 and V1 is large.

FIG. 17 is a timing chart illustrating the operation of a voltage booster circuit (a comparative example), using the level shift circuit according to the related art shown in FIG. 18 as each of the four-phase clock generating circuits, when the difference between the voltage levels V2 and V1 is large.

As can be seen by comparing FIG. 17 to FIG. 16, in the case shown in FIG. 17, the delay time set to the four-phase clock CLK1 to CLK4 is shortened to Tw1 or Tw2. For this reason, the timing margin of the voltage booster circuit is not sufficiently ensured, resulting in insufficiency of the time for transferring charges from the drain to source of the charge transfer transistor and insufficiency of the time for equalizing the source and gate of the charge transfer transistor by the switching transistor. As a result, the voltage boosting efficiency of the voltage booster circuit is drastically reduced.

The level shift circuit according to the embodiment of the invention can suppress an increase in the delay time regardless of the difference between the voltage levels V2 and V1. Therefore, in the case of using the level shift circuit according to the embodiment of the invention as the clock generating circuit 901 of the voltage booster circuit shown in FIG. 13, even when the difference between the voltage levels V2 and V1 is large, the exact operation as shown in FIG. 16 is performed and the timing margin of the voltage boosting cell 902 is ensured. Therefore, problems, such as a reduction in the voltage boosting capability as shown in FIG. 17, do not occur.

As described above, when a voltage dropping circuit is provided to only one of the two main inverters of the level shift circuit according to the embodiment of the invention, it is possible to realize a level shift circuit appropriate to a single-ended output type.

In the level shift circuit according to the embodiment of the invention, when the level of the input signal is changed, the level of the first control signal obtained from the output node no1 of the first inverter is instantaneously dropped, the second inverter is immediately driven, and the operation of the first inverter is immediately controlled by the second control signal output from the second inverter so as to accelerate the variation in the potential of the output node no1. Therefore, even when the potential difference between the low level power voltage V1 and the high level power voltage V2 becomes large, it is possible to quickly invert the voltage level of the output signal and to efficiently suppress the increase in the size of the transistor.

Further, in the single-ended-output-type level shift circuit, the balance between the current capability of the first inverter and the current capability of the second inverter is optimized taking notice that the second inverter does not directly contribute to the generation of the output signal. Further, as for the first inverter, the sufficient current capability is ensured to secure rapid output of the output signal, and as for the second inverter, the size of the transistor is reduced (minimized) while ensuring the required minimum current capability. Therefore, it is possible to reduce the area occupied by the circuit while ensuring the circuit operation at high speed.

When using the level shift circuit according to the embodiment of the invention as the clock generating circuit, it is possible to reduce the delay of the clock signal whose level has been converted. Therefore, even when the voltage difference between the low level power voltage V1 and the high level power voltage V2 increases, it is possible to ensure a predetermined operation margin in each voltage boosting cell. Therefore, it is possible to always perform a stable voltage boosting operation. The level shift circuit according to the embodiment of the invention can be used as a two-phase or four-phase clock generating circuit.

The level shift circuit according to the embodiment of the invention has a characteristic in which the local inversion is quickly performed regardless of the difference between the voltage levels of the power voltages (V2-V1), and is thus useful as a clock generating circuit of a voltage booster circuit, a non-volatile semiconductor memory device, etc. Further, the level shift circuit according to the embodiment of the invention can be applied to semiconductor memory devices, such as DRAM, liquid crystal apparatuses, power supply circuits for portable apparatuses, level shifters of power voltages in inter-chip interfaces, etc.

What is claimed is:

1. A level shift circuit, comprising:
a first inverter that functions as a level converting unit for convening a voltage level of an input signal VSIN;
a second inverter that receives a signal obtained by inverting the voltage level of the input signal of the first inverter; and
a voltage dropping circuit CONT1 that drops down a voltage level of a first control signal CS1 to a level capable of inverting the level of an output signal of the second inverter,
wherein the first control signal CS1 for controlling the operation of the second inverter is output from an output node no1 of the first inverter,
a second control signal CS2 for controlling the operation of the first inverter is output from an output node no2 of the second inverter and the second control signal CS2 is connected directly to the first inverter without an intermediate circuit, and
the first control signal CS1 is supplied to the second inverter through the voltage dropping circuit CONT1.

2. The level shift circuit according to claim 1,
wherein the first inverter is composed of first and second MOS transistors Mn1 and Mp1 which are connected in series between power voltages and have different conduction types,
one of the first and second MOS transistors is directly driven by the input signal VSIN and the other MOS transistor is driven by the second control signal output from the second inverter such that the first and second MOS transistors Mn1 and Mp1 are complementarily driven to output an output signal VSO of the first inverter and the first control signal CS1 from the common node no1 of the first and second MOS transistors,
the second inverter is composed of third and fourth MOS transistors Mn2 and Mp2 which are connected in series between the power voltages and have different conduction types, and
one of the third and fourth MOS transistors is driven by the signal obtained by inverting the voltage level of the input signal VSIN and the other MOS transistor is driven by the first control signal CSI whose voltage level has been dropped down by means of the voltage dropping circuit CONT1 such that the third and fourth MOS transistors Mn2 and Mp2 are complementarily driven to output the second control signal CS2 from a common node no2 of the third and fourth MOS transistors.

3. The level shift circuit according to claim 1,
wherein the input signal is a signal VSIN output from a circuit operating between a first power potential V1 and a common power potential V3,
the first inverter is composed of a first NMOS transistor Mn1 and a first PMOS transistor Mp1 which are connected in series between a second power potential V2 and the common power potential V3,
one of the first NMOS transistor Mn1 and the first PMOS transistor Mp1 is directly driven by the input signal VSIN and the other thereof is driven by the second control signal CS2 output from the second inverter,
the second inverter is composed of a second NMOS transistor Mn2 and a second PMOS transistor Mp2 which are connected in series between the second power potential V2 and the common power potential V3, and
one of the second NMOS transistor Mn2 and the second PMOS transistor Mp2 is driven by the signal obtained by inverting the voltage level of the input signal VSIN and the other thereof is driven by the first control signal CS1 having passed through the voltage dropping circuit CONT1.

4. The level shift circuit according to claim 3,
wherein, when the input signal VSIN is changed from a low level to a high level, the voltage dropping circuit CONT1 drops down the voltage level of the first control signal CS1 output from the first inverter by an amount of voltage drop that is equal to or more than the absolute value of the threshold value of the high-potential-side second PMOS transistor Mp2 constituting the second inverter, and
the first control signal CS1 whose voltage level has been dropped is supplied to the second PMOS transistor Mp2 to immediately turn on the second PMOS transistor Mp2, and thus the second control signal CS2 is output to the first inverter so as to immediately reduce the current capability of the first PMOS transistor Mp1 of the first inverter.

5. The level shift circuit according to any one of claims 1 to 4,
wherein the voltage dropping circuit CONT1 drops down the voltage level of the first control signal CS1 using a diode-connected MOS transistor (MOS diode).

6. The level shift circuit according to claim 3 or 4,
wherein, in the first inverter, the current capability of the first NMOS transistor Mn1 is larger than the current capability of the first PMOS transistor Mp1.

7. The level shift circuit according to claim 3 or 4,
wherein the size of the second PMOS transistor Mp2 constituting the second inverter is smaller than the size of the first PMOS transistor Mp1 constituting the first inverter.

8. The level shift circuit according to claim 7,
wherein the size of the second PMOS transistor Mp2 constituting the second inverter is minimized as long as the second PMOS transistor Mp2 has only the current capability capable of turning on the first PMOS transistor Mp1 constituting the first inverter.

9. The level shift circuit according to claim 1,
wherein the voltage dropping circuit CONT1 receives the second control signal CS2 output from an output node no2 of the second inverter.

10. A level shift circuit comprising:
a fifth inverter that functions as a level converting unit for converting a voltage level of an input signal VSIN;
a sixth inverter that receives a signal obtained by inverting the voltage level of the input signal of the fifth inverter; and
a logic circuit that receives a second control signal CS12 for controlling the operation of the fifth inverter and outputs a third control signal CS10 to the fifth inverter,
wherein a first control signal CS11 for controlling the operation of the sixth inverter is output from an output node no11 of the fifth inverter, and
the second control signal CS12 is output from an output node no12 of the sixth inverter and the second control signal CS12 is connected directly to the fifth inverter without an intermediate circuit.

11. The level shift circuit according to claim 9,
wherein the substrate bias of a MOS transistor Mp7 or Mp11 constituting the voltage dropping circuit has the same potential as a MOS transistor Mp2 or Mp12 constituting the second inverter outputting a control signal for the MOS transistor Mp7 or Mp11.

12. The level shift circuit according to claim 10,
wherein the logic circuit is composed of eleventh and twelfth MOS transistors Mn10 and Mp10 whose conductivity types are different from each other, and
the eleventh and twelfth MOS transistors are driven by the second control signal CS12 output from the sixth inverter.

13. The level shift circuit according to claim 12,
wherein a gate of a thirteenth MOS transistor Mp13 constituting the fifth inverter is directly driven by the input signal VSIN.

14. The level shift circuit according to claim 12,
wherein a gate of a thirteenth MOS transistor Mp13 constituting the fifth inverter is driven by the second control signal CS12 output from the sixth inverter.

15. The level shift circuit according to any one of claims 10 to 11,
wherein the substrate bias for a MOS transistor Mp11, Mp13, or Mp14 constituting the fifth inverter has the same potential as a MOS transistor Mp12 constituting a sixth inverter outputting a control signal for the MOS transistor Mp7 or Mp11.

16. A voltage booster circuit comprising:
clock generating circuits each using the level shift circuit according to any one of claims 1-4 or 9-11 convert a voltage level of an original clock signal, and outputting the clock signal whose voltage level has been convened; and
a plurality of voltage boosting cells whose internal operations are controlled by the generated clock signals.

17. The level shift circuit according to any one of claims 10 to 14,
wherein the substrate bias of a MOS transistor Mp7 or M11 constituting a voltage dropping circuit has the same potential as a MOS transistor Mp2 or Mp12 constituting the sixth inverter outputting a control signal for the MOS transistor Mp7 or Mp11.

* * * * *